(12) United States Patent
Yang et al.

(10) Patent No.: US 10,755,635 B2
(45) Date of Patent: Aug. 25, 2020

(54) ORGANIC LIGHT-EMITTING DISPLAY DEVICE AND RELATED DRIVING METHOD

(71) Applicant: Samsung Display Co., Ltd., Yongin-si, Gyeonggi-do (KR)

(72) Inventors: Su Min Yang, Yongin-si (KR); Cheol Min Kim, Seongnam-si (KR); Dong Won Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 105 days.

(21) Appl. No.: 15/869,459

(22) Filed: Jan. 12, 2018

(65) Prior Publication Data

US 2019/0096321 A1   Mar. 28, 2019

(30) Foreign Application Priority Data

Sep. 27, 2017  (KR) .................. 10-2017-0125226

(51) Int. Cl.
*G09G 3/32*      (2016.01)
*H01L 27/32*    (2006.01)
(Continued)

(52) U.S. Cl.
CPC ......... *G09G 3/3233* (2013.01); *G09G 3/3266* (2013.01); *G09G 3/3275* (2013.01); *G09G 3/3291* (2013.01); *H01L 27/124* (2013.01); *H01L 27/322* (2013.01); *H01L 27/3211* (2013.01); *H05B 45/60* (2020.01); *G09G 2300/0819* (2013.01);
(Continued)

(58) Field of Classification Search
CPC ... G09G 3/32–3291; G09G 2300/0439; G09G 2300/0819; G09G 2300/0842; G09G 2300/0861; G09G 2310/0262; G09G 2310/08; G09G 2320/0233; G09G 2320/0242; G09G 2320/0285; G09G 2320/029; G09G 2320/0295; G09G 2320/043; G09G 2320/045; G09G 2320/0626–0653; G09G 2320/0257–0266; H01L 27/124; H01L 27/3211; H01L 27/322; H05B 33/0896
See application file for complete search history.

(56) References Cited

U.S. PATENT DOCUMENTS 9,495,909 B2    11/2016 Tani et al.
2015/0187267 A1*  7/2015 Park ..................... G09G 3/3233
                                            345/77

(Continued)

OTHER PUBLICATIONS

European Search Report, Application No. 18170243.2, dated Jun. 15, 2018, pp. 1-15.

*Primary Examiner* — Nathan Danielsen
(74) *Attorney, Agent, or Firm* — Innovation Counsel LLP

(57) ABSTRACT

An organic light-emitting display device may include a first pixel, a first data line, a first scan line, a data driver, and a scan driver. The first pixel unit may include a sensing transistor and a scan transistor. The data driver may be electrically connected to the scan transistor through the first data line. The scan driver may be electrically connected to the scan transistor through the first scan line. The scan transistor may be turned on during a first period and a second period. The sensing transistor may be turned on during a third period between the first period and the second period. The first period, the second period, and the third period are included in one frame.

20 Claims, 21 Drawing Sheets

(51) Int. Cl.

|  |  |
|---|---|
| *G09G 3/3233* | (2016.01) |
| *G09G 3/3291* | (2016.01) |
| *H01L 27/12* | (2006.01) |
| *G09G 3/3275* | (2016.01) |
| *G09G 3/3266* | (2016.01) |
| *H05B 45/00* | (2020.01) |

(52) U.S. Cl.
CPC ............... *G09G 2300/0842* (2013.01); *G09G 2300/0861* (2013.01); *G09G 2310/0262* (2013.01); *G09G 2320/0285* (2013.01); *G09G 2320/0295* (2013.01); *G09G 2320/043* (2013.01)

(56) References Cited

U.S. PATENT DOCUMENTS

| 2015/0187268 A1* | 7/2015 | Tani ..................... G09G 3/3233 |
|---|---|---|
| | | 345/77 |
| 2015/0243721 A1* | 8/2015 | Jeon .................... H01L 27/3262 |
| | | 257/40 |
| 2016/0086544 A1 | 3/2016 | Park et al. |
| 2016/0104419 A1* | 4/2016 | Chung ................. G09G 3/3225 |
| | | 345/78 |
| 2016/0321990 A1 | 11/2016 | Kim et al. |
| 2017/0061877 A1 | 3/2017 | Lee |

* cited by examiner

ORGANIC LIGHT-EMITTING DISPLAY DEVICE AND RELATED DRIVING METHOD

This application claims priority to Korean Patent Application No. 10-2017-0125226 filed on Sep. 27, 2017 in the Korean Intellectual Property Office, and all the benefits under 35 U.S.C. 119; the contents of the Korean Patent Application are herein incorporated by reference.

BACKGROUND

1. Field

The technical field relates to an organic light-emitting display device and a method for driving the organic light-emitting display device.

2. Description of the Related Art

Modern display devices include liquid-crystal display (LCD) devices and organic light-emitting display (OLED) devices.

An organic light-emitting display device displays images using organic light-emitting devices that emit light as electrons and holes recombine. An organic light-emitting display device has one or more of the following advantages: fast response speed, high luminance, a large viewing angle, and low power consumption.

SUMMARY

Embodiments are related to an organic light-emitting display device capable of measuring hysteresis characteristics in real-time, and a method for driving the organic light-emitting display device.

Embodiments are related to an organic light-emitting display device with improved accuracy in measuring hysteresis characteristics, and a method for driving the organic light-emitting display device.

According to embodiments, it is possible to measure hysteresis in real-time during a period in which images are displayed.

In embodiments, it is possible to improve the accuracy in measuring the hysteresis.

An embodiment is related to an organic light-emitting display device that may include the following elements: a first pixel unit comprising a sensing transistor and a scan transistor; a first data line; a first scan line; a data driver connected to the scan transistor through the first data line; and a scan driver connected to the scan transistor through the first scan line. The scan transistor may be turned on during a first period and a second period. The sensing transistor may be turned on during a third period between the first period and the second period. The first period, the second period, and the third period may be included in one frame (i.e., included in a same frame period of operation of the organic light-emitting display device).

The scan transistor may be turned off during the third period. The sensing transistor may be turned off during each of the first period and the second period.

The device may include a signal path. The first pixel further may include a driving transistor electrically connected to the scan transistor, and further may include an organic light-emitting diode electrically connected to the driving transistor through the signal path. The sensing transistor may be electrically connected to the signal path.

The data driver may provide a first data signal corresponding to measurement data to the first pixel during the first period, and may provide a second data signal corresponding to grayscale data to the first pixel during the second period.

The sensing transistor may measure a driving current of the driving transistor corresponding to the first data signal during the third period.

The scan transistor may include a first terminal electrically connected to the first data line, a control electrode electrically connected to the first scan line, and a second terminal electrically connected through no intervening transistor to a first terminal of the driving transistor, The driving transistor may include a control electrode electrically connected through no intervening transistor to a first node and a second terminal electrically connected to the organic light-emitting diode. The sensing transistor may include a first terminal electrically connected to the second terminal of the driving transistor and a second terminal electrically connected through no intervening transistor to the first data line.

The first pixel further may include the following elements: a compensating transistor including a control electrode electrically connected to the first scan line, a first terminal electrically connected to the first node, and a second terminal electrically connected to the second terminal of the driving transistor; and an initializing transistor including a first terminal receiving an initialization voltage and a second terminal electrically connected to the first node.

The device may include the following elements: a second scan line immediately neighboring the first scan line with no intervening scan line; and a second pixel electrically connected to the second scan line. The second pixel may receive a scan signal having a turn-on level from the second scan line after the second period.

The device may include the following elements: a second scan line immediately neighboring the first scan line with no intervening scan line; and a second pixel electrically connected to the second scan line. The second pixel may include a compensating transistor having a control electrode electrically connected to the second scan line and a first terminal receiving an initialization voltage, and a driving transistor having a control electrode electrically connected to a second terminal of the compensating transistor. The control electrode of the driving transistor of the second pixel may receive the initialization voltage during the first period and the third period.

An embodiment is related to an organic light-emitting display device that may include the following elements: a plurality of pixels including a first pixel, the first pixel comprising a sensing transistor and a scan transistor; a first data line; a first scan line; a data driver connected to one electrode of the scan transistor through the first data line; and a scan driver connected to a control electrode of the scan transistor through the first scan line. The scan transistor may receive, from the data driver, a first data signal based on measurement data during a first period and a second data signal based on grayscale data during a second period. The sensing transistor may be turned on during a third period between the first period and the second period. The first period, the second period, and the third periods may be included in a first frame (i.e., included in a same frame period of operation of the organic light-emitting display device).

The scan transistor may be turned on in each of the first period and the second period.

The first pixel further may include a driving transistor electrically connected, through no intervening transistor, to a second terminal of the scan transistor. The sensing transistor may be electrically connected to a first terminal of the driving transistor.

The device may include a timing controller configured to determine a hysteresis area among the plurality of pixels based on an image signal provided from an external device. The first pixel may be included in the hysteresis area. The sensing transistor may measure a sensing voltage corresponding to the first data signal during the third period.

The timing controller generates compensation data based on the sensing voltage. The data driver may provide a third data signal based on the compensation data to the first terminal of the scan transistor.

The first terminal of the scan transistor may receive the third data signal during a second frame subsequent to the first frame.

An embodiment is related to a method for driving an organic light-emitting display device. The organic light-emitting display device may include a first pixel. The first pixel may include a scan transistor and a sensing transistor. The method may include the following steps: providing a first scan signal to turn on the scan transistor during a first period; providing a second scan signal to turn on the scan transistor during a second period subsequent to the first period; and providing a sensing signal to turn on the sensing transistor during a third period between the first period and the second period. The first period, the second period, and the third period may be included in a first frame (i.e., included in a same frame period of operation of the organic light-emitting display device).

A first terminal of the scan transistor may receive, through a data line, a first data signal based on measurement data during the first period and a second data signal based on grayscale data during the second period.

The first pixel further may include a driving transistor electrically connected, through no intervening transistor, to a second terminal of the scan transistor. The sensing transistor may be electrically connected to the driving transistor.

The sensing transistor may measure a sensing voltage corresponding to the first data signal during the third period.

The sensing transistor may provide the sensing voltage measured during the third period to the data line.

The first terminal of the scan transistor may receive a data signal corresponding to the compensation data generated based on the sensing voltage during a second frame subsequent to the first frame.

DETAILED DESCRIPTION OF EMBODIMENTS

Figure 1:
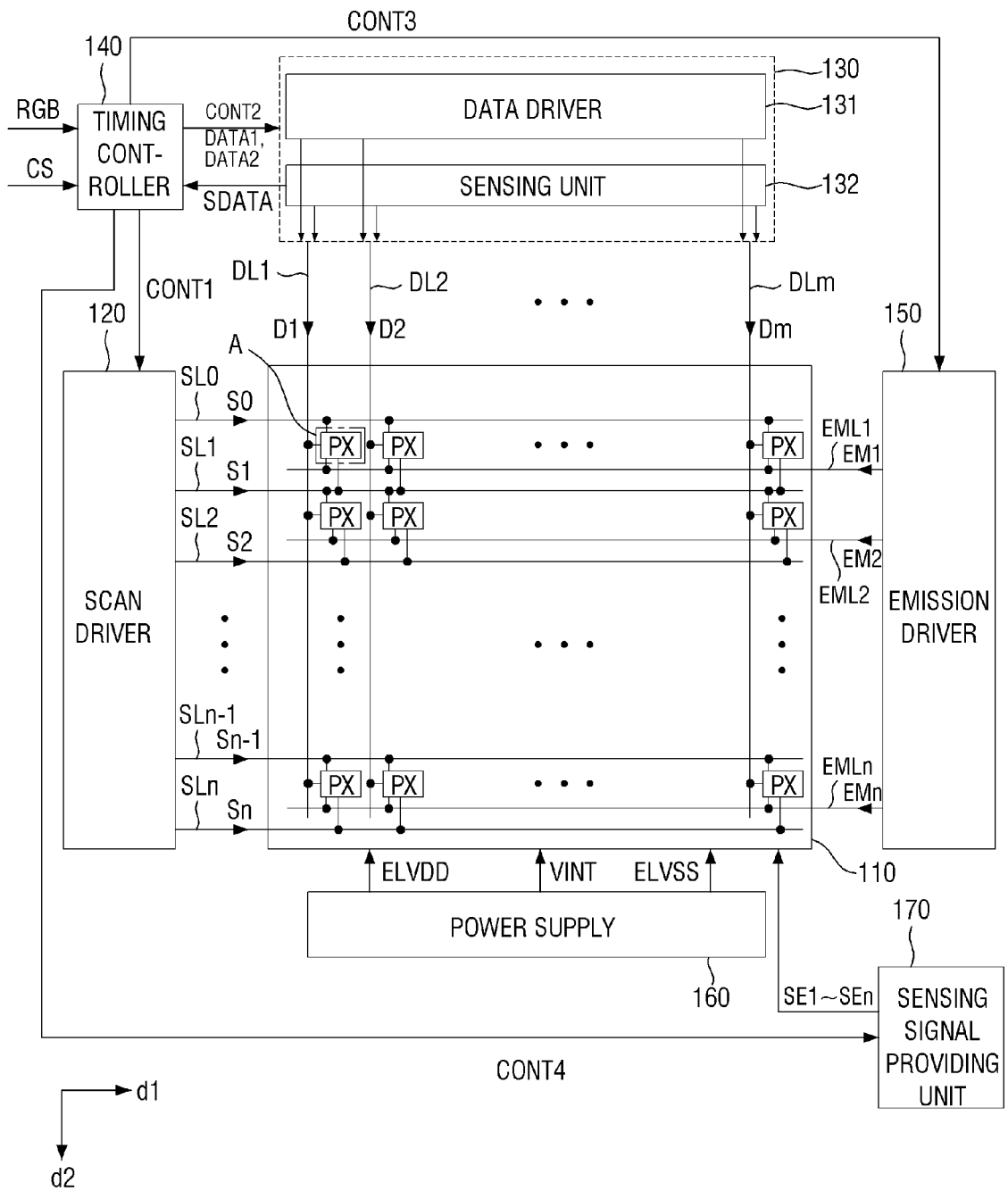
FIG. 1 is a block diagram of an organic light-emitting display device according to an embodiment.

In the following description, for the purposes of explanation, specific details are set forth with accompanying figures in order to enable thorough understanding of embodiments. The embodiments are examples and may be practiced without these specific details or with one or more equivalent arrangements. In some figures, structures and devices may be shown in block diagram form.

In the accompanying figures, sizes of elements may be exaggerated for clarity and descriptive purposes. Like reference numerals may denote like elements.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on," "connected to," or "coupled to" a second element, the first element may be directly on, connected to, or coupled to the second element, or one or more intervening elements may be present between the first element and the second element. When a first element is referred to as being "directly on," "directly connected to," or "directly coupled to" a second element, there are no intended intervening elements (except environmental elements such as air) present between the first element and the second element.

Spatially relative terms, such as "beneath," "below," "lower," "above," "upper," and the like, may be used to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" may include the plural forms as well, unless the context clearly indicates otherwise. The terms "comprises," "comprising," "includes," and/or "including" may specify the presence of stated steps and/or elements, but do not preclude the presence or addition of one or more other steps and/or elements.

Various embodiments are described herein with reference to sectional illustrations that are schematic illustrations of embodiments and/or intermediate structures. As such, variations from the shapes of the illustrations as a result, for example, of manufacturing techniques and/or tolerances, are possible. Thus, embodiments disclosed herein should not be construed as limited to the particular illustrated shapes of regions, but are to include deviations in shapes that result from, for instance, manufacturing.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In this application, the term "connected" may mean one or more of "electrically connected," "electrically connected through no intervening transistor," "electrically connected through one transistor," "electrically connected through multiple transistors," etc. The term "pixel unit" may mean "pixel."

FIG. 1 is a block diagram of an organic light-emitting display device according to an embodiment.

Referring to FIG. 1, an organic light-emitting display device may include a display unit 110, a scan driver 120, a data driving circuit 130, a timing controller 140, an emission driver 150, a power supply 160, and a sensing signal providing unit 170.

The display unit 110 is defined as an area where images are displayed. A plurality of pixel units PX (or pixels PX) is arranged on the display unit 110. The plurality of pixel units PX may be connected to first to $n^{th}$ scan lines SL1 to SLn extending in a first direction d1, and a first to mth data lines DL1 to DLm extending in a second direction d2, where n and m are natural numbers equal to or greater than one. The plurality of pixel units PX may also be connected to first to $n^{th}$ emission control lines EML1, EML2, to EMLn extending in the opposite direction to the first direction of FIG. 1. The first direction d1 may intersect with the second direction d2. In FIG. 1, the first direction d1 refers to the row direction, while the second direction d2 refers to the column direction. The directions in which the scan lines, the data lines and the emission control lines are extended shown in FIG. 1 are merely illustrative and are not particularly limited as long as they are insulated from one another.

The connective relationship between the plurality of pixel units PX and the scan lines, the data lines and the emission control lines shown in FIG. 1 will be described in more detail.

In an embodiment, each of the plurality of pixel units PX may be connected to two of the first to $n^{th}$ scan lines SL1 to SLn. For example, each of the plurality of pixel units PX may be connected to the scan line connected to the row in which it is located and the scan line connected to the previous row. It is to be noted that a pixel unit PX disposed in area A may be connected not only to the first scan line SL1 but also to the dummy scan line SL0 connected to the previous row. In the following description, the first to $n^{th}$ scan lines SL1 to SLn and the dummy scan line SL0 are referred to as a plurality of scan lines SL0, SL1, SL2 to SLn-1, SLn, and the signals provided from the plurality of scan lines SL0 to SLn are referred to as scan signals S0, S1, S2 to Sn-1 and Sn, respectively.

The scan driver 120 may be connected to the plurality of pixel units PX through the plurality of scan lines SL0 to SLn. More specifically, the scan driver 120 may generate the plurality of scan signals S0 to Sn based on a first control signal CONT1 provided from the timing controller 140. The scan driver 120 may provide the generated scan signals S0 to Sn to the plurality of pixel units PX through the plurality of scan lines SL0 to SLn.

The data driving circuit 130 may include a data driver 131 and a sensing unit 132.

The data driver 131 may be connected to the plurality of pixel units PX through the first to mth data lines DL1, DL2, to DLm. More specifically, the data driver 131 may receive a second control signal CONT2, first image data DATA1 and second image data DATA2 from the timing controller 140. The data driver 131 may generate the first to mth data signals D1, D2, to Dm based on the second control signal CONT2, the first image data DATA1 and the second image data DATA2. The data driver 131 may provide the generated first to mth data signals D1 to Dm to the plurality of pixel units PX through the first to mth data lines DL1 to DLm. The data driver 131 may include a shift register, a latch, a digital-to-analog converter, etc.

The sensing unit 132 may be connected to the plurality of pixel units PX through the first to mth data lines DL1 to DLm. More specifically, the sensing unit 132 may measure hysteresis characteristics of a pixel unit located in an area determined that there occurred hysteresis. In the following description, an area determined that there occurred hysteresis is defined as a hysteresis area. The number of pixel units included in the hysteresis area is not particularly limited herein. For example, a hysteresis area may include a single pixel unit. For another example, a hysteresis area may include a plurality of pixel units. In the following description, it is assumed that a hysteresis area includes a pixel unit.

The sensing unit 132 may convert the measured hysteresis characteristics into sensing data SDATA, and then provide the sensing data SDATA to the timing controller 140. As described above, the data driver 131 and the sensing unit 132 may be connected to the plurality of pixel units PX through the first to mth data lines DL1 to DLm. To this end, the data driving circuit 130 may further include a switching unit 133 (see FIG. 3) for selectively connecting the data driver 131 or the sensing unit 132 to the plurality of data lines DL1 to DLm. In order to provide the first to mth data signals D1 to Dm to the plurality of pixel units PX, the switching unit 133 may perform the switching operations to electrically connect the data driver 131 with the plurality of pixel units PX. On the other hand, in order to measure the hysteresis of a hysteresis area, the switching unit 133 may perform the switching operations to electrically connect the sensing unit 132 to the plurality of pixel units PX.

The timing controller 140 may receive an image signal RGB and a control signal CS from an external device. The image signal RGB may include a plurality of grayscale data items to be provided to the plurality of pixel units PX. In an embodiment, the control signal CS may include a horizontal synchronization signal, a vertical synchronization signal, and a main clock signal. The horizontal synchronization signal represents the time taken to display a single line of the display unit 110. The vertical synchronization signal represents the time taken to display an image of a single frame. The main clock signal is a signal used as a reference when the timing controller 140 is in synchronization with the scan driver 120 and the data driver 131 for generating various signals.

The timing controller 140 may process the image signal RGB and the control signal CS appropriately for the operation conditions of the display unit 110, to generate the first image data DATA1, the second image data DATA2, the first control signal CONT1, the second control signal CONT2, the third control signal CONT3 and the fourth control signal CONT4.

In an embodiment, the timing controller 140 may determine a hysteresis area based on the image signal RGB. The timing controller 140 may adjust the data signal, the scan signal, the sensing signal and the emission control signal provided to the hysteresis area in order to measure the hysteresis of the hysteresis area. Detailed description thereof will be made later.

The sensing unit 132 may convert the measured hysteresis into sensing data SDATA, and then provide the sensing data SDATA to the timing controller 140. The timing controller 140 may generate compensation data based on the sensing data SDATA and may provide the compensation data to the data driver 131. The compensation data is defined as data in which hysteresis is compensated for.

The emission driver 150 may be connected to the plurality of pixel units PX through the first to the $n^{th}$ emission control lines EML1 to EMLn. The emission driver 150 may generate the first to the $n^{th}$ emission control signals EM1, EM2, to EMn based on the third control signal CONT3 received from the timing controller 140. The emission driver 150 may provide the generated first to $n^{th}$ emission control signals EM1 to EMn to the plurality of pixel units PX through the first to the $n^{th}$ emission control lines EML1 to EMLn.

The power supply 160 may provide a first driving voltage ELVDD, a second driving voltage ELVSS and an initialization voltage VINT to the plurality of pixel units PX. The level of the first driving voltage ELVDD may be higher than the level of the second driving voltage ELVSS.

The sensing signal providing unit 170 may generate first to the $n^{th}$ sensing signals SE1 to SEn based on the fourth control signal CONT4 received from the timing controller 140. The sensing signal providing unit 170 may measure a hysteresis of the hysteresis area by providing a sensing signal to a pixel unit disposed the hysteresis area.

In an embodiment, the sensing signal providing unit 170 may be connected to each of the plurality of pixel units PX through a plurality of sensing lines. That is, the plurality of pixel units PX may be connected to the plurality of sensing lines, respectively. In an embodiment, each of the plurality of sensing lines may be connected to pixel units PX arranged in a row. In the embodiment, by providing a sensing signal to a pixel unit disposed in the hysteresis area, the sensing signal may be provided to the other pixel units disposed in the same row.

The sensing signal providing unit 170 may be implemented as an integrated circuit (IC). In an embodiment, the sensing signal providing unit 170 may be included in the timing controller 140 or the data driving circuit 130.

Next, the plurality of pixel units PX will be described in more detail with reference to FIG. 2.

Figure 2:
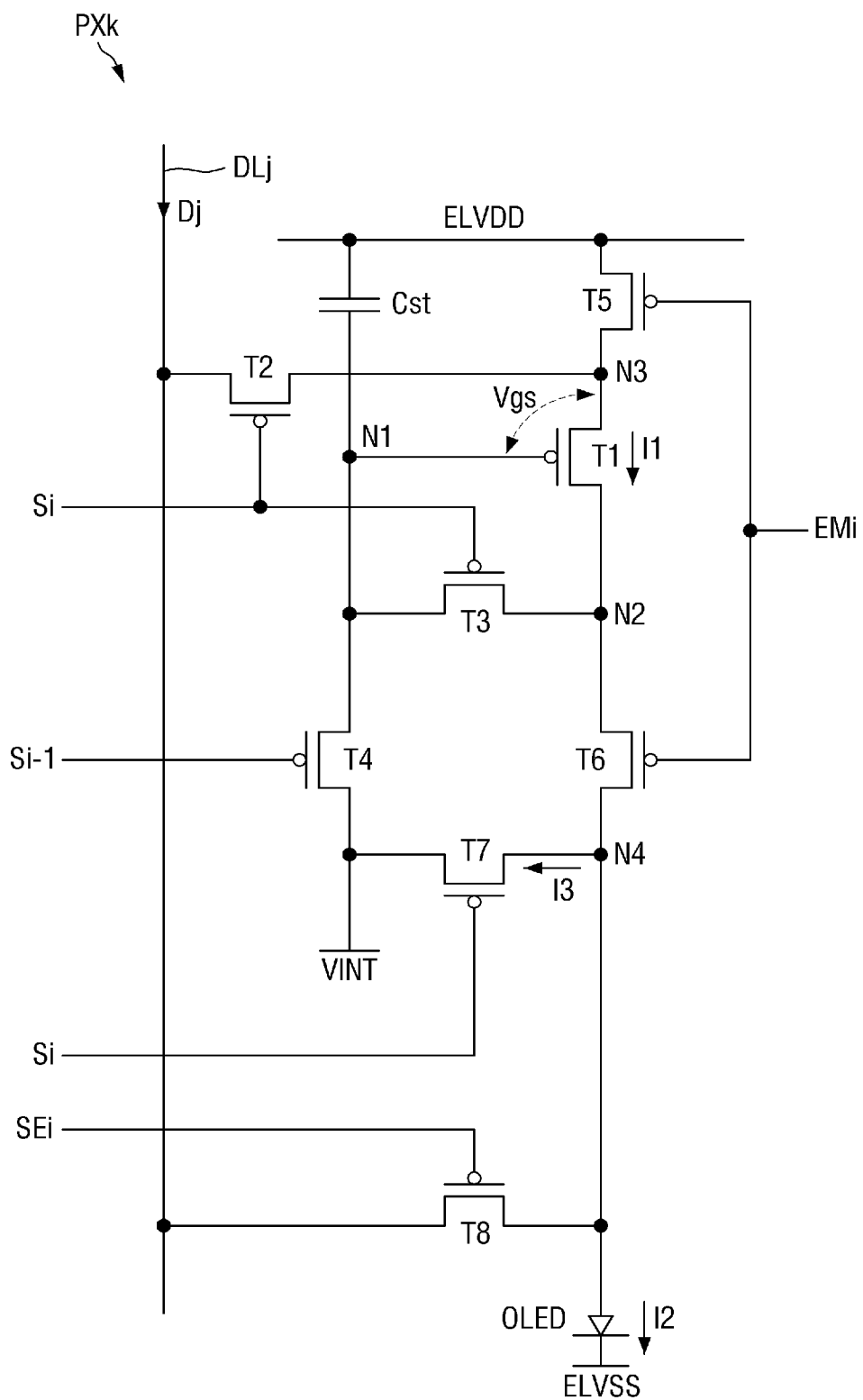
FIG. 2 is an equivalent circuit diagram of a first pixel unit (or first pixel) among the plurality of pixel units (or pixels) shown in FIG. 1 according to an embodiment.

FIG. 2 is an equivalent circuit diagram of the first pixel unit among the plurality of pixel units shown in FIG. 1. Hereinafter, the $k^{th}$ pixel unit PXk among the plurality of pixel units PX will be described. The $k^{th}$ pixel unit PXk is defined as a pixel unit receiving the $i^{th}$ scan signal Si, the $(i-1)^{th}$ scan signal S(i-1), the $j^{th}$ data signal Dj, the $i^{th}$ emission control signal EMi and the $i^{th}$ sensing signal SEi, where i and j are natural numbers equal to or greater than one.

Referring to FIG. 2, the $k^{th}$ pixel unit PXk may include first to eighth transistors T1 to T8, a storage capacitor Cst, and an organic light-emitting diode (OLED). Each of the first to eighth transistors T1 to T8 may include a control electrode, an input electrode, and an output electrode. In the following description, the control electrode is referred to as a gate electrode, the input electrode is referred to as a source electrode, and the output electrode is referred to as a drain electrode. It is to be understood that the type of the first to eighth transistors T1 to T8 is not particularly limited herein. For example, they may be NMOS transistors, unlike those shown in the drawings.

The first transistor T1 may include a gate electrode connected to a first node N1, a source electrode connected to a third node N3, and a drain electrode connected to a second node N2. The second transistor T2 may include a gate electrode receiving the $i^{th}$ scan signal Si, a source electrode connected to the $j^{th}$ data line DLj, and a drain electrode connected to the third node N3.

The second transistor T2 may perform a switching operation based on the $i^{th}$ scan signal Si so that the $j^{th}$ data signal Dj is provided to the source electrode of the first transistor T1 connected to the third node N3. The first transistor T1 may adjust the amount of the driving current I1 supplied to the organic light-emitting diode OLED based on the received $j^{th}$ data signal Dj.

This will be described in more detail. The first transistor T1 may control the driving current I1 provided to the organic light-emitting diode OLED according to the potential difference Vgs between the gate electrode and the source electrode (hereinafter referred to as gate-source voltage Vgs). More specifically, the first transistor T1 is turned on when the gate-source voltage Vgs is greater than the threshold voltage Vth. When the voltage level at the source electrode of the first transistor T1 becomes greater than the threshold voltage of the organic light-emitting diode OLED, the current between the source electrode and the drain electrode of the first transistor T1, i.e., the driving current I1 is provided to the organic light-emitting diode OLED. That is, the first transistor T1 may be a driving transistor. The second transistor T2 may be a scan transistor.

The third transistor T3 may include a gate electrode receiving the $i^{th}$ scan signal Si, a source electrode connected to the drain electrode of the first transistor T1, and a drain electrode connected to the gate electrode of the first transistor T1. The third transistor T3 may perform a switching operation based on the $i^{th}$ scan signal Si to connect the source electrode with the gate electrode of the first transistor T1. Accordingly, the third transistor T3 may compensate for the threshold voltage Vth of the first transistor T1 by performing the switching operation so that the first transistor T1 is diode-connected. That is, the third transistor T3 may be a compensating transistor.

When the first transistor T1 is diode-connected, a voltage equal to the $j^{th}$ data signal Dj applied to the source electrode of the first transistor T1 minus the threshold voltage Vth of the first transistor T1 may be applied to the gate electrode of the first transistor T1. The voltage Vj corresponding to the $j^{th}$ data signal Dj minus the threshold voltage Vth of the first transistor T1 is referred to as a voltage Vj-Vth reflecting the threshold voltage Vth.

Since the gate electrode of the first transistor T1 is connected to one electrode of the storage capacitor Cst, the voltage Vk-Vth reflecting the threshold voltage Vth is held by the storage capacitor Cst. Since the voltage Vk-Vth reflecting the threshold voltage Vth of the first transistor T1 is applied to and held at the gate electrode, the driving current I1 flowing through the first transistor T1 is not affected by the threshold voltage Vth. As a result, variations in the threshold voltage of the first transistor T1 can be compensated for, and the luminance can be substantially uniform.

The fourth transistor T4 may include a gate electrode at which the $(i-1)^{th}$ scan signal S(i-1) is received, a source electrode at which the initialization voltage VINT is received, and a drain electrode connected to the first node N1. The fourth transistor T4 may perform a switching operation based on the $(i-1)^{th}$ scan signal S(i-1) to provide the initialization voltage VINT to the first node N1. As described above, the first node N1 is connected to the gate electrode of the first transistor T1. In addition, the $(i-1)^{th}$ scan signal Si-1 is applied earlier than the $i^{th}$ scan signal Si.

Therefore, the fourth transistor T4 is turned on before the second transistor T2 is turned on, such that the initialization voltage VINT may be applied to the gate electrode of the first transistor T1. The voltage level of the initialization voltage VINT is not particularly limited as long as the voltage level of the gate electrode of the first transistor T1 can be lowered sufficiently. That is, the fourth transistor T4 may be an initializing transistor.

The fifth transistor T5 may include a gate electrode receiving the $i^{th}$ emission control signal EMi, a source electrode receiving the first driving voltage ELVDD, and a drain electrode connected to the third node N3. The fifth transistor T5 may perform a switching operation based on the $i^{th}$ emission control signal EMi to apply the first driving voltage ELVDD to the source electrode of the first switching element T1 connected to the third node N3.

The sixth transistor T6 may include a gate electrode receiving the $i^{th}$ emission control signal EMi, a source electrode connected to the second node N2, and a drain electrode connected to the fourth node N4. The sixth transistor T6 may perform a switching operation based on the $i^{th}$ emission control signal EMi to form a current path so that the driving current I1 flows toward the organic light-emitting diode OLED. The organic light-emitting diode OLED may emit light in response to an emission current I2 corresponding to the driving current I1. That is, the fifth transistor T5 and the sixth transistor T6 may be emission-controlling transistors.

The seventh transistor T7 may include a gate electrode receiving the $i^{th}$ scan signal Si, a source electrode receiving the initialization voltage VINT, and a drain electrode connected to the fourth node N4. A bypass current I3 may flow from the fourth node N4 to the seventh transistor T7 by the set voltage of the initialization voltage VINT when the seventh transistor T7 is turned off.

When the minimum current of the first transistor T1 for displaying a black image flows as the driving current I1, if the organic light emitting device OLED emits light, the black image is not properly displayed. That is, the seventh transistor T7 can allow some of the minimum current of the first transistor T1 to flow in other current paths than the organic light-emitting diode OLED as the bypass current I3. The minimum current of the first transistor T1 refers to the current when the gate-source voltage Vgs of the first transistor T1 is lower than the threshold voltage Vth of the first transistor T1 such that the first transistor T1 is turned off. The black image is displayed when the minimum driving current under the condition that the first transistor T1 is turned off is delivered to the organic light-emitting diode OLED. When the minimum driving current for displaying a black image flows, the influence by the bypass current I3 is significant. On the contrary, when a driving current for displaying an ordinary or white image flows, the influence by the bypass current I3 is ignorable. Accordingly, when the driving current for displaying a black image flows, the emission current I2 of the organic light-emitting diode OLED, which is equal to the amount of the driving current I1 minus the bypass current I3 flowing toward the seventh transistor T7, has the minimum amount of current sufficient to clearly display the black image. Therefore, a black image is accurately displayed, such that the contrast ratio can be improved. That is, the seventh transistor T7 may be a bypass transistor. It is to be noted that the seventh transistor T7 may perform a switching operation based on the $(i-1)^{th}$ scan signal S(i-1) instead of the $i^{th}$ scan signal Si, unlike the one shown in FIG. 2.

The eighth transistor T8 may include a gate electrode receiving the $i^{th}$ sensing signal SEi, a source electrode connected to the first transistor T1, and a drain electrode connected to the $j^{th}$ data line DLj. The eighth transistor T8 may perform a switching operation based on the $i^{th}$ sensing signal SEi to measure the hysteresis characteristics of the first transistor T1 and may provide them to the sensing unit 132 (see FIG. 1) through the $j^{th}$ data line DLj. That is, the eighth transistor T8 may be a sensing transistor.

Hereinafter, an operation of an organic light-emitting display device according to an embodiment will be described.

First, the signal flow between the data driving circuit 130 and the timing controller 140 described above with reference to FIG. 1 will be described with reference to FIG. 3. For convenience of illustration, the $k^{th}$ pixel unit PXk connected to the data driving circuit 130 through the $i^{th}$ data line DLj will be described as an example.

Figure 3:
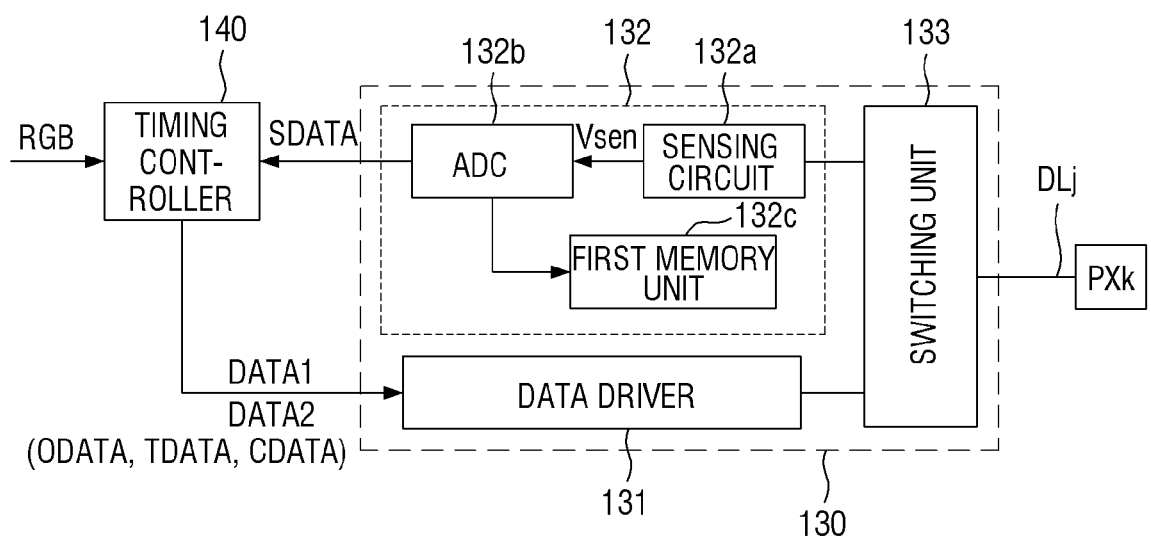
FIG. 3 is a diagram for illustrating signal flow among the timing controller, the data driving circuit and the pixel unit shown in FIG. 1 according to an embodiment.

FIG. 3 is a diagram for illustrating signal flow among the timing controller, the data driving circuit and the pixel unit shown in FIG. 1.

Referring to FIGS. 2 and 3, the data driving circuit 130 may include a data driver 131, a sensing unit 132, and a switching unit 133.

The data driver 131 may receive the first image data DATA1 or the second image data DATA2 from the timing controller 140. The first image data DATA1 is defined as grayscale data to be provided to the pixel units PX located in other areas of the display unit 110 than the hysteresis area. That is, the first image data DATA1 is defined as grayscale data to be provided to the pixel units PX that do not require hysteresis measurement. The second image data DATA2 is defined as grayscale data to be provided to a pixel unit PX disposed in the hysteresis area (e.g., the $k^{th}$ pixel unit PXk) that requires hysteresis characteristics measurement.

In an embodiment, the second image data DATA2 may include grayscale data ODATA, measurement data TDATA, and compensation data CDATA. The grayscale data ODATA is defined as data having grayscale levels to be displayed by the $k^{th}$ pixel unit PXk. The measurement data TDATA is defined as data provided to the first transistor T1 for measuring hysteresis. The compensation data CDATA is defined as data in which the hysteresis characteristic of the first transistor T1 is compensated for.

The timing controller 140 may provide the data driver 131 with the measurement data TDATA for measuring the hysteresis of the hysteresis area using the image signal RGB. The data driver 131 may generate the $j^{th}$ data signal Dj corresponding to the received measurement data TDATA and provide it to the $k^{th}$ pixel unit PXk located in the hysteresis area.

After providing the measurement data TDATA, the timing controller 140 may provide the data driver 131 with the grayscale data ODATA. The data driver 131 may generate the $j^{th}$ data signal Dj corresponding to the grayscale data ODATA to provide it to the $k^{th}$ pixel unit PXk. As described above, the grayscale data ODATA has a grayscale level that is intended to be displayed by the $k^{th}$ pixel unit PXk.

The grayscale data ODATA may be equal to or different from the measurement data TDATA. When the measurement data TDATA and the grayscale data ODATA are identical to each other, the $k^{th}$ pixel unit PXk may measure the hysteresis of the $k^{th}$ pixel unit PXk based on the grayscale data ODATA.

The sensing unit 132 may include a sensing circuit 132a, an analog-to-digital converter (ADC) 132b, and a first memory unit 132c. The sensing circuit 132a may generate a sensing voltage Vsen using the driving current I1 flowing through the first transistor T1 of the $k^{th}$ pixel portion PXk. The sensing circuit 132a may provide the sensing voltage Vsen to the ADC 132b.

The ADC 132b may convert the sensing voltage Vsen of an analog signal into sensing data SDATA of a digital signal and then may provide the sensing data SDATA to the first memory unit 132c and the timing controller 140. The ADC 132b may be provided, one for each channel or one for several channels. Alternatively, one ADC 132b may be shared by all the channels.

The first memory unit 132c may store the sensing data SDATA of a digital signal provided from the ADC 132b. Unlike the one shown in FIG. 3, the first memory unit 132c may receive the sensing voltage Vsen of an analog signal directly from the sensing circuit 132a. In an embodiment, the first memory unit 132c may be a lookup table (LUT). In some implementations, the first memory unit 132c may be eliminated.

If it is necessary to measure hysteresis of only some of pixel units arranged in a given pixel row, data signals based on the first image data DATA1 may be provided to the other of the pixel units that do not require hysteresis measurement. On the other hand, the timing controller 140 may provide data signals based on the second image data DATA2 to pixel units that require hysteresis measurement.

The switching unit 133 may electrically connect the data driver 131 with the $j^{th}$ data line DLj or the sensing unit 132 with the $j^{th}$ data line DLj by performing switching operations. For example, when the $j^{th}$ data signal Dj is provided to the $k^{th}$ pixel unit PXk, the switching unit 133 may perform a switching operation to electrically connect the data driver 131 with the $j^{th}$ data line DLj. On the other hand, if it is necessary to measure the hysteresis of the hysteresis area, the switching unit 133 may perform a switching operation to electrically connect the sensing unit 132 with the $j^{th}$ data line DLj.

The timing controller 140 may receive the sensing data SDATA and generate the compensation data CDATA in which the hysteresis characteristics are compensated for. As described above, the compensation data CDATA refers to data in which the hysteresis of the $k^{th}$ pixel unit PXk is compensated for. This will be described below in more detail with reference to FIG. 4.

A detailed description thereof will be made below with reference to FIGS. 4 and 5.

Figure 4:
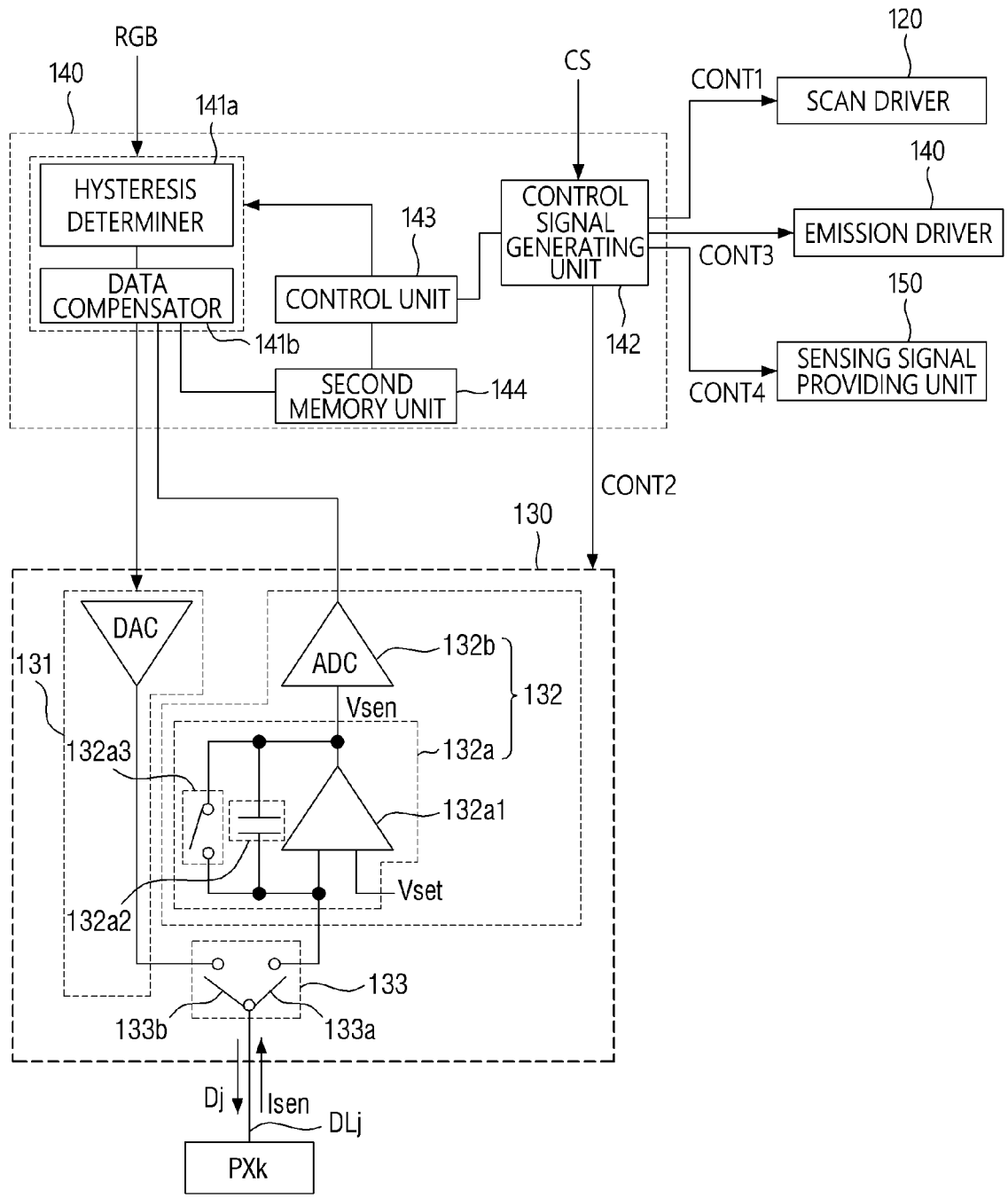
FIG. 4 is a block diagram showing in detail the timing controller and the data driving circuit shown in FIG. 3 according to an embodiment.
Figure 5:
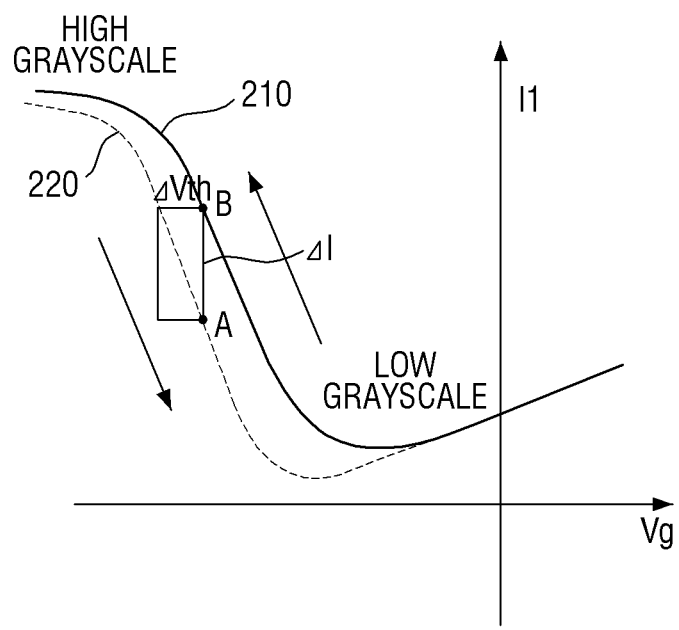
FIG. 5 is a graph for illustrating hysteresis characteristics according to an embodiment.

FIG. 4 is a block diagram showing in detail the timing controller and the data driving circuit shown in FIG. 3. FIG. 5 is a graph for illustrating hysteresis characteristics.

First, the hysteresis will be described with reference to FIGS. 2 and 5.

When the $j^{th}$ data signal Dj is applied to the first transistor T1 included in the $k^{th}$ pixel unit PXk, the driving current I1 flowing through the first transistor T1 may be represented by a first curve 210. The driving current I1 may have a first amount of current B. If the $j^{th}$ data signal Dj having the same grayscale level is continuously applied to the first transistor T1, hole trapping may occur in the first transistor T1. Due to the hole trapping, the driving current I1 may appear on a second curve 220. The driving current I1 may represent a second amount of current A.

That is, if the first transistor T1 continuously receives the $j^{th}$ data signal Dj having the same grayscale level value, the first transistor T1 may have the hysteresis characteristics that the threshold voltage Vth shifts in the negative direction such that the magnitude of the driving current I1 is reduced.

On the other hand, when the luminance of the $k^{th}$ pixel unit PXk changes from a high grayscale level (e.g., white grayscale level) to an intermediate grayscale level, the absolute value of the gate voltage |Vg| of the first transistor T1 on the second curve 220 is changed from a larger value to a smaller value. Since the gate voltage having a relatively large absolute value |Vg| is first applied to the first transistor T1 at the high grayscale level, the absolute value |Vth| of the threshold voltage of the first transistor T1 is increased. Then, when the gate voltage Vg corresponding to the intermediate grayscale level is applied to the first transistor T1, the amount of the driving current I1 may be indicated by point A.

On the other hand, when the luminance of the $k^{th}$ pixel unit PXk changes from a low grayscale level (e.g., black grayscale level) to an intermediate grayscale level, the absolute value of the gate voltage |Vg| of the first transistor T1 on the first curve 210 is changed from a smaller value to a larger value. Since the gate voltage having a relatively small absolute value |Vg| is first applied to the first transistor T1 at the low grayscale level, the absolute value |Vth| of the threshold voltage of the first transistor T1 is decreased by ΔVth. Then, when the gate voltage Vg corresponding to the intermediate grayscale level is applied to the first transistor T1, the amount of the driving current I1 may be indicated by point B.

Accordingly, even if the same gate voltage Vg is applied to the first transistor T1 to express the luminance of the intermediate grayscale level, the amount of current flowing through the organic light-emitting diode OLED is different depending on the prevent luminance (the hysteresis characteristics of the first transistor T1). Such difference in the amount of current may be denoted by ΔI. Such difference in the amount of current may result in a residual image. A hysteresis area may be determined based on the above definition of hysteresis.

This will be described again with reference to FIG. 4. The timing controller 140 may determine the hysteresis area based on the image signal RGB received from an external device. In an embodiment, the timing controller 140 may accumulate and store the image signals RGB, and then determine the hysteresis area based on the accumulated image signals RGB.

This will be described in more detail. The timing controller 140 may include an image data generating unit 141, a control signal generating unit 142, a control unit 143, and a second memory unit 144.

The image data generating unit 141 may include a hysteresis determiner 141a and a data compensator 141b.

The hysteresis determiner 141a may determine the hysteresis area based on the image signal RGB received from an external device. A method of determining the hysteresis area is not particularly limited herein. In an embodiment, the hysteresis determining unit 141a may accumulate and store the image signals RGB, and then determine the hysteresis area based on the accumulated image signals RGB. To this end, in an embodiment, the hysteresis determining unit 141a may include a frame buffer.

For example, when the grayscale level included in the image signal RGB provided to the display unit 110 remains at a low grayscale level for a while and then is changed to a high grayscale level, the hysteresis determiner 141a may determine that an area where the high grayscale level is provided as the hysteresis area. In addition, when the grayscale level included in the image signal RGB provided to the display unit 110 remains at a high grayscale level for a while and then is changed to a low grayscale level, the hysteresis determiner 141a may determine that an area where the low grayscale level is provided as the hysteresis area.

After determining the hysteresis area, the hysteresis determiner 141a may provide measurement data TDATA, grayscale data ODATA, and compensation data CDATA to the hysteresis area. As described above, it is assumed that the $k^{th}$ pixel unit PXk is disposed in the hysteresis area, and accordingly the hysteresis determiner 141a may adjust the $i^{th}$ scan signal Si, the $j^{th}$ data signal Dj, the $i^{th}$ emission signal EMi and the $i^{th}$ sensing signal SEi provided to the $k^{th}$ pixel unit PXk.

The data compensator 141b may generate the compensation data CDATA by correcting the image signal RGB based on the sensing data SDATA and compensation information stored in the second memory unit 144 to be described later, to provide it to the data driver 131. A method for correcting the image signal RGB to generate the compensation data CDATA is not particularly limited as long as the hysteresis characteristic of the first transistor T1 can be compensated for.

The control signal generating unit 142 may generate the first to fourth control signals CONT1 to CONT4 based on the control signal CS received from an external device, to provide them to the scan driver 120, the data driver 130 and the emission driver 150. As described above, the control signal CS may include the horizontal synchronization signal Hsync, the vertical synchronization signal Vsync, the main clock signal, the data enable signal, etc.

Once the hysteresis determiner 141a determines the hysteresis area, the control signal generating unit 142 may adjust the $i^{th}$ scan signal Si output from the scan driver 120 with the first control signal CONT1. In addition, the control signal generating unit 142 may adjust the $j^{th}$ data signal Dj output from the data driver 131 with the second control signal CONT2. Furthermore, the control signal generating unit 142 may adjust the $i^{th}$ emission control signal EMi output from the emission driver 150 with the third control signal CONT3 and may adjust the $i^{th}$ sensing signal SEi output from the sensing signal providing unit 170 with the fourth control signal CONT4. The signal flow of the $i^{th}$ scan signal Si, the $j^{th}$ data signal Dj, the $i^{th}$ sensing signal SEi and the emission control signal EMi will be described later with reference to FIG. 7.

The control unit 143 controls the overall operation of the timing controller 140. The control unit 143 may control operations of the image signal generating unit 141, the control signal generating unit 142, and the like by transmitting and receiving control signals. In an embodiment, the control unit 143 may be a micro controller unit or main controller unit (MCU).

The second memory unit 144 may store data provided from the image signal generating unit 141 or the like, or may provide compensation information to the image signal generating unit 141. In an embodiment, the second memory unit 144 may store device information containing the resolution, the driving frequency and the timing information of the display unit 110 (see FIG. 1), compensation information for generating the compensation data CDATA, etc. In an embodiment, the second memory unit 144 may include a special function register (SFR) and/or a lookup table (LUT). Unlike the one shown in FIG. 4, the second memory unit 144 may be located outside the timing controller 140.

Next, the sensing unit 132 will be described focusing on the connection with the $j^{th}$ data line DLj.

First, the data driving circuit 130 will be described in more detail. Elements already described above with reference to FIGS. 1 and 3 may not be described again.

The data driver 131 may include a digital-to-analog converter (DAC). The digital-to-analog converter (DAC) may be electrically connected to the timing controller 140 and a first switch 133a. The data driver 131 may receive the first image data DATA1 and the second image data DATA2 of analog signals from the timing controller 140 and generate the $k^{th}$ data signal Dk of a digital signal.

The sensing unit 132 may include a sensing circuit 132a and an ADC 132b. In FIG. 4, the first memory unit 132c (see FIG. 3) will not be described. The sensing circuit 132a may be connected to the ADC 132b and the second switch 133b.

The sensing circuit 132a may include an operational amplifier 132a1, a feedback capacitor 132a2, and a feedback switch 132a3.

the operational amplifier 132a1 may include a first input terminal, a second input terminal, and an output terminal. A reference voltage Vset may be applied to the first input terminal of the operational amplifier 132a1. The second input terminal of the operational amplifier 132a1 may be connected to one end of the second switch 133b, one end of the feedback capacitor 132a2, and one end of the feedback switch 132a3. In an embodiment, the first input terminal of the operational amplifier 132a1 may be a non-inverting input terminal (+), while the second input terminal thereof may be an inverting input terminal (−).

One end of the feedback capacitor 132a2 may be connected to the second input terminal of the operational amplifier 132a1, and the other end thereof may be connected to the output terminal of the operational amplifier 132a1. One end of the feedback switch 132a2 may be connected to the second input terminal of the operational amplifier 132a1, and the other end thereof may be connected to the output terminal of the operational amplifier 132*a*1. The feedback capacitor 132*a*2 and the feedback switch 132*a*3 may be connected with each other in parallel.

The switching unit 133 may include a first switch 133*a* and a second switch 133*b*. In an embodiment, the first switch 133*a* and the second switch 133*b* may perform switching operations based on the second control signal CONT2 (see FIG. 1) provided from the timing controller 140. Although not shown in the drawings, the switching unit 133 may further include a switch for electrically connecting the initialization voltage terminal providing the initialization voltage with the $j^{th}$ data line DLj.

The operation of the sensing circuit 132*a* will be described later.

Figure 6A:
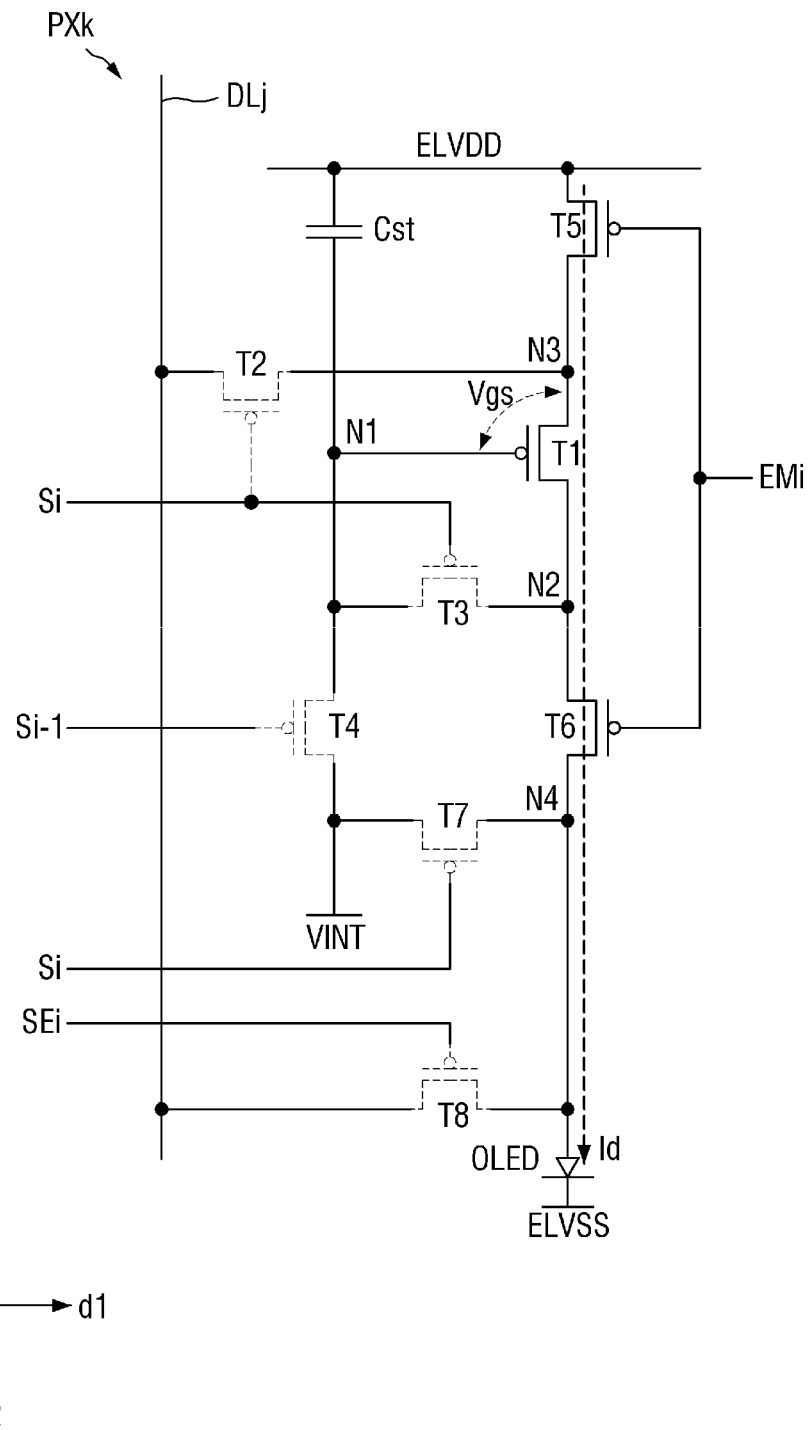
FIG. 6A is an equivalent circuit diagram of the $k^{th}$ pixel unit when it displays images according to an embodiment.
Figure 6B:
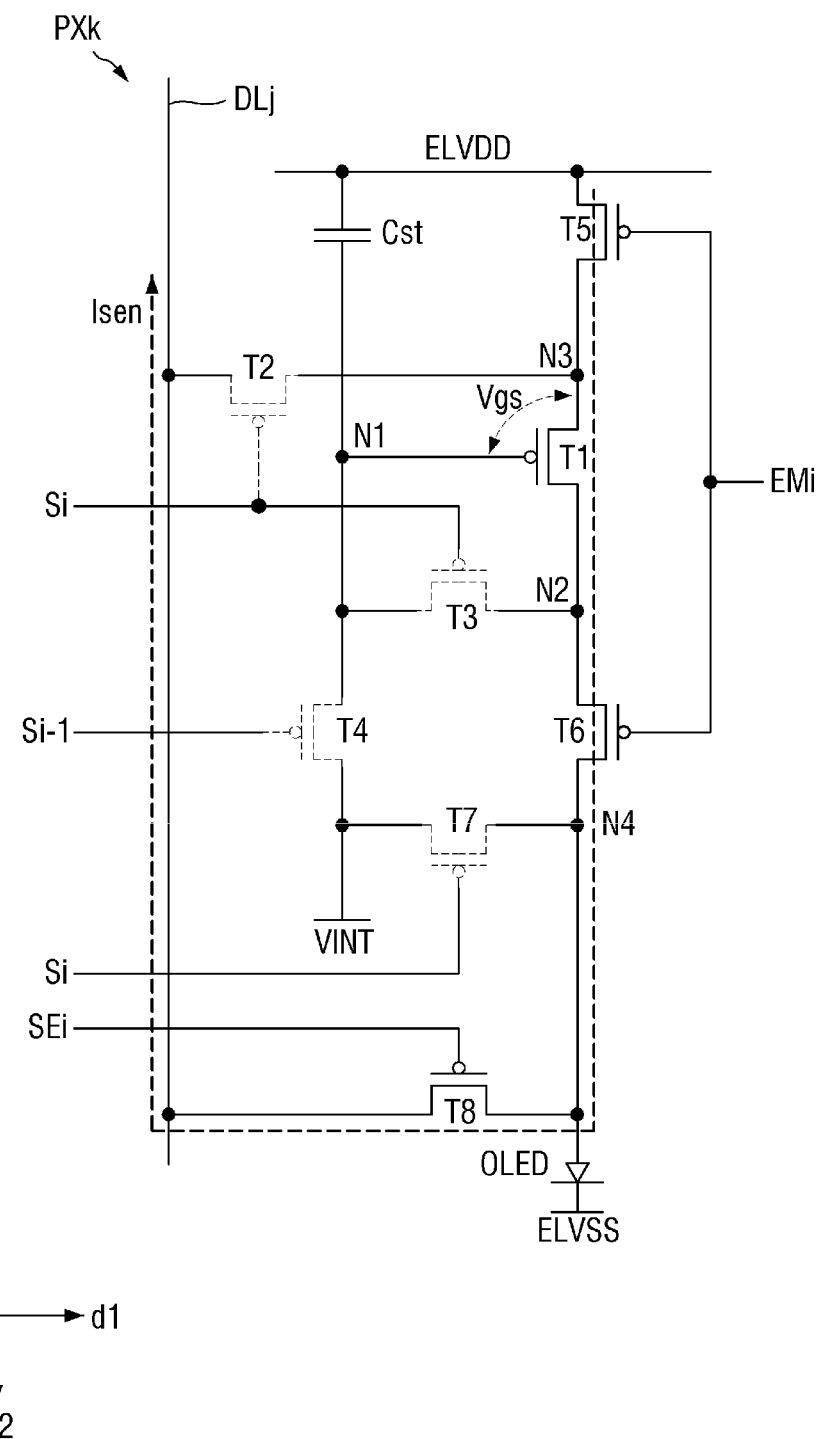
FIG. 6B is an equivalent circuit diagram of the $k^{th}$ pixel unit when it measures the hysteresis according to an embodiment.

FIG. 6A is an equivalent circuit diagram of the $k^{th}$ pixel unit when it displays images. FIG. 6B is an equivalent circuit diagram of the $k^{th}$ pixel unit when it measures the hysteresis.

Referring to FIGS. 4 and 6A, when the $j^{th}$ data signal Dj is provided to the $k^{th}$ pixel unit PXk, the first switch 133*a* is turned on, such that a signal path between the data driver 131 and the $j^{th}$ data line DLj is connected. More specifically, the timing controller 140 may provide the data driver 131 with first image data DATA1 corresponding to an image to be displayed by the $k^{th}$ pixel unit PXk. The data driver 131 may convert the received first image data DATA1 to generate the $j^{th}$ data signal Dj. Accordingly, the $j^{th}$ data signal Dj corresponding to the first image data DATA1 may be provided to the $k^{th}$ pixel unit PXk connected to the $j^{th}$ data line DLj. The first transistor T1 of the $k^{th}$ pixel unit PXk may adjust the amount of the driving current Id flowing to the organic light-emitting diode OLED based on the $j^{th}$ data signal Dj provided to the $k^{th}$ pixel unit PXk.

On the other hand, referring to FIGS. 4 and 6B, if it is necessary to measure the hysteresis of the $k^{th}$ pixel unit PXk, a signal path between the sensing portion 132 and the $j^{th}$ data line DLj is connected as the second switch 133*b* is turned on. The feedback switch 132*a*3 may be turned on in advance, to form a short-circuit between the output terminal and the second input terminal of the operational amplifier 132*a*1. Accordingly, the potential at the output terminal of the operational amplifier 132*a*1 can be held at the reference voltage Vset.

Thereafter, when the feedback switch 132*a*3 is turned off, the operational amplifier 132*a*1 may work as an integrator. The second input terminal of the operational amplifier 132*a*1 may be electrically connected to the first transistor T1 through the eighth transistor T8 of the $k^{th}$ pixel unit PXk. The feedback capacitor 132*a*3 may be charged with a voltage corresponding to the sensing current Isen flowing through the eighth transistor T8 of the $k^{th}$ pixel unit PXk. Accordingly, the potential at the output terminal of the operational amplifier 132*a*1 may increase linearly with the voltage corresponding to the sensing current Isen from the reference voltage Vset. The operational amplifier 132*a*1 may provide the increased voltage to the ADC 132*b* as the sensing voltage Vsen. The ADC 132*b* may provide the timing controller 140 with the sensing data SDATA converted from the sensing voltage Vsen.

The timing controller 140 may generate the compensation data CDATA in which the hysteresis has been compensated for based on the sensing data SDATA. The timing controller 140 provides the compensation data CDATA to the data driver 131 so that a data signal based on the compensation data CDATA can be provided to the $k^{th}$ pixel unit PXk included in the hysteresis area. A method for generating the compensation data is not particularly limited as long as the hysteresis characteristic of the first transistor T1 can be compensated for.

Hereinafter, a method for driving an organic light-emitting display device according to an embodiment will be described in detail with reference to FIGS. 7 to 17. As described above, it is assumed that it is necessary to measure the hysteresis of the $k^{th}$ pixel unit PXk. The operation of the first pixel unit PX1 will also be described for comparison with the operation of the $k^{th}$ pixel unit PXk. The first pixel unit PX1 is defined as a pixel unit that is connected to the first data line DL1, the first scan line SL1 and the first emission control line EML1 and does not measure the hysteresis. In the following description, the operation of the first pixel unit PX1 is referred to as the normal mode, while the operation of the $k^{th}$ pixel unit PXk is referred to as the hysteresis measurement mode.

Figure 7:
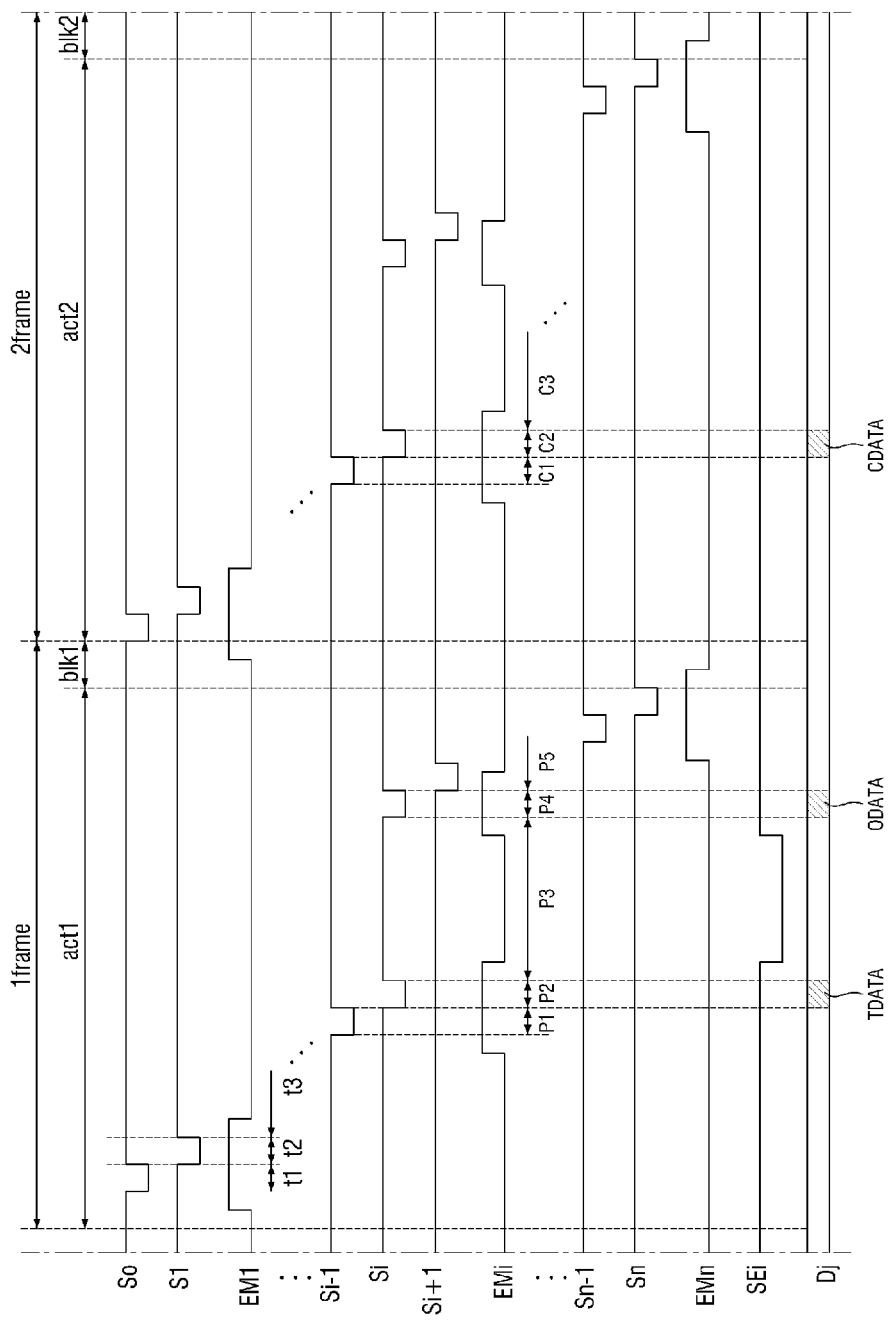
FIG. 7 is a timing diagram for illustrating modes of the organic light-emitting display device according to an embodiment.

FIG. 7 is a timing diagram for illustrating modes of the organic light-emitting display device according to an embodiment. FIGS. 8 to 10 are diagrams for illustrating the normal mode of the first pixel unit. FIGS. 11 to 15 are diagrams for illustrating the hysteresis measurement mode of the $k^{th}$ pixel unit.

Referring first to FIG. 7, each of a first frame (or first frame period) 1frame and a second frame (or second frame period) 2frame may include an active period and a blank period. For the first frame 1frame, the first active period act1 is defined as a period within the first frame 1frame in which the first image data DATA1 or the second image data DATA2 for displaying an image is input. The first blank period blk1 is defined as a period within the first frame 1frame in which the first image data DATA1 and the second image data DATA2 for displaying an image are not inputted.

The $k^{th}$ pixel unit PXk may receive the $i^{th}$ scan signal Si having two turn-on levels during the first frame 1frame. The turn-on level refers to a level at which the transistor receiving the $i^{th}$ scan signal Si can be turned on, and may be, for example, a low level. During a period between the two turn-on levels of the $i^{th}$ scan signals Si, a turn-on level of the $i^{th}$ sensing signal SEi is provided. The period in which the turn-on level of the $i^{th}$ sensing signal SEi is provided is defined as a sensing period. On the other hand, the pixel row which receives the same $i^{th}$ scan signal Si as the $i^{th}$ pixel unit PXk may be provided with the $i^{th}$ scan signal Si having two turn-on levels during the first frame 1frame. On the other hand, if a pixel unit that does not require hysteresis measurement may receive a scan signal having one turn-on level during the first frame 1frame. For example, the first pixel unit PX1 may receive a first scan signal S1 having one turn-on level during the first frame 1frame.

Hereinafter, the operation of the $k^{th}$ pixel unit PXk and the first pixel unit PX1 will be described in more detail. For convenience of illustration, the first pixel unit PX1 will be described first with reference to FIGS. 8A to 10B.

Figure 8A:
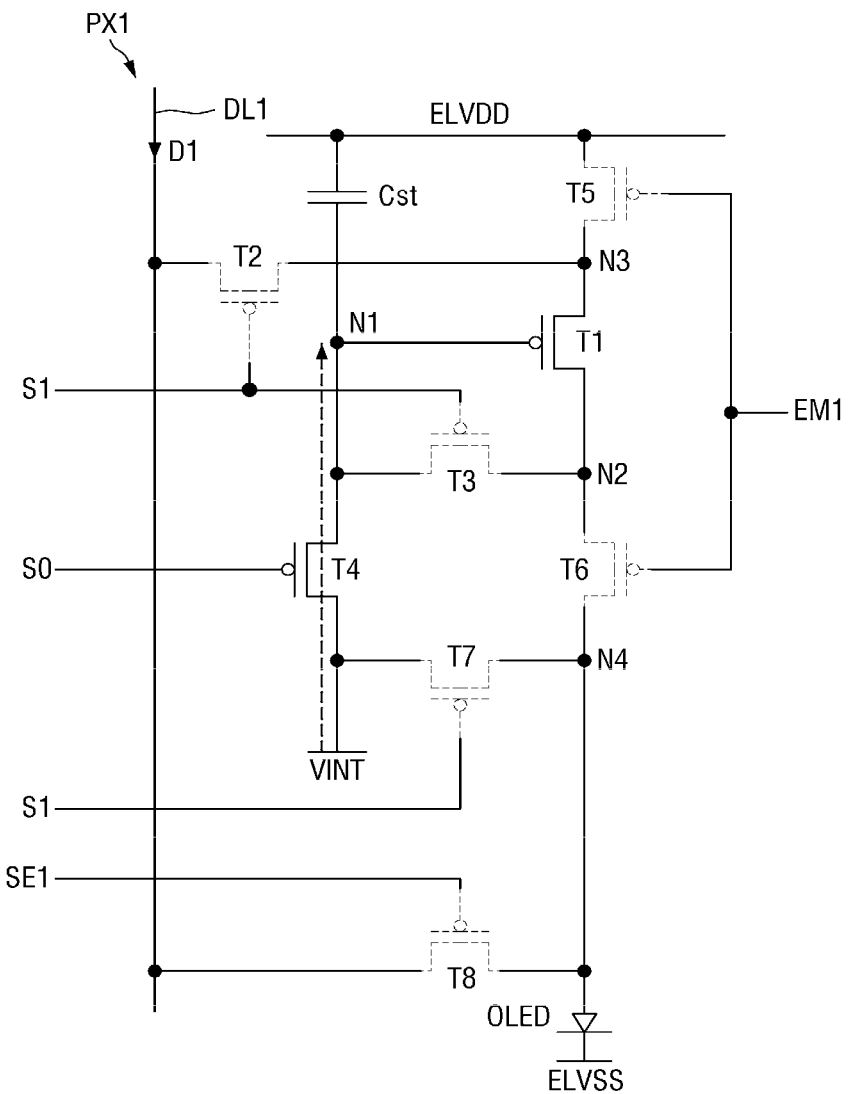
FIG. 8A, FIG. 8B, FIG. 9A, FIG. 9B, FIG. 10A, and FIG. 10B are diagrams for illustrating the normal mode of the first pixel unit according to one or more embodiments.
Figure 8B:
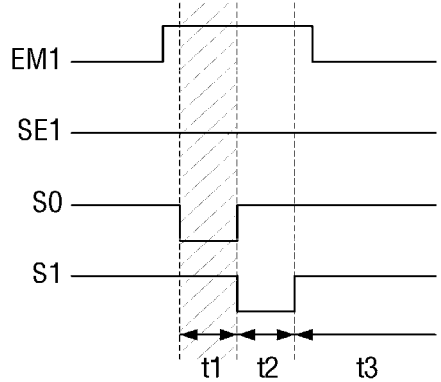

Referring to FIG. 8A and FIG. 8B, during the first driving period t1, the dummy scanning signal S0 is switched from the high level to the low level. The first sensing signal SE1, the first scan signal S1 and the first emission control signal EM1 remain at the high level.

When the dummy scan signal S0 is switched from the high level to the low level, the fourth transistor T4 of the first pixel unit PX1 is turned on. The fourth transistor T4 of the first pixel unit PX1 may provide the initialization voltage VINT to the first node N1. The level of the initialization voltage VINT may be set to be low enough to initialize the first node N1. Since the gate electrode of the first transistor T1 of the first pixel unit PX1 is electrically connected to the first node N1, it is set to the initialization voltage VINT.

Figure 9A:
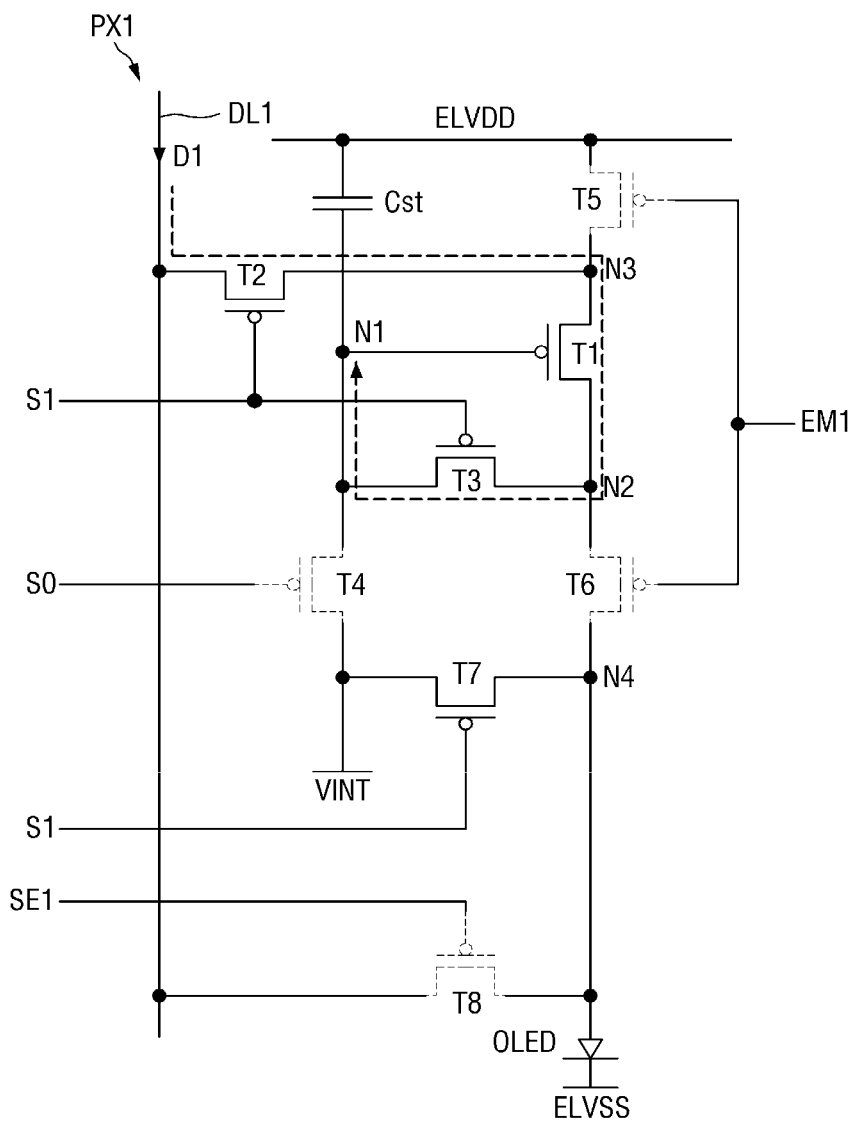
Figure 9B:
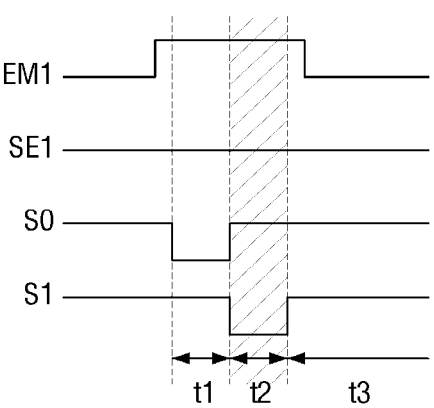

Referring to FIG. 9A and FIG. 9B, during the second driving period t2, the first scan signal Si is switched from the high level to the low level. Further, the dummy scan signal S0 is switched from the low level to the high level. The first sensing signal SE1 and the first emission control signal EM1 remain at the high level.

As a result, the second transistor T2, the third transistor T3 and the seventh transistor T7 of the first pixel unit PX1 are turned on, and the fourth transistor T4 is turned off. When the third transistor T3 of the first pixel unit PX1 is turned on, the first transistor T1 becomes diode-connected. The first data signal D1 supplied from the first data line DL1 through the second transistor T2 of the first pixel unit PX1 is supplied to the first node N1 via the third node N3 and the third transistor T3. Since the first transistor T1 of the first pixel unit PX1 is diode-connected, the first node N1 receives a voltage equal to the difference between the voltage corresponding to the first data signal D1 and the threshold voltage Vth of the first transistor T1. Specifically, the first node N1 of the first pixel unit PX1 receives a voltage equal to the voltage corresponding to the first data signal D1 minus the absolute value of the threshold voltage Vth of the first transistor T1 of the first pixel unit PX1.

The storage capacitor Cst of the first pixel unit PX1 stores the charges corresponding to the voltage difference between the difference voltage provided at the first node N1 and the first driving voltage ELVDD. On the other hand, when the seventh transistor T7 of the first pixel unit PX1 is turned on, the fourth node N4 is set to the initialization voltage VINT.

The third driving period t3 is defined as an emission period. Referring to FIG. 9B and FIG. 10B, during the third driving period t3, the first sensing signal SE1 and the dummy scanning signal S0 remain at the high level. The first scan signal S1 is switched from the low level to the high level. After the first scan signal S1 is switched from the low level to the high level, the first emission control signal EM1 is switched from the high level to the low level.

Figure 10A:
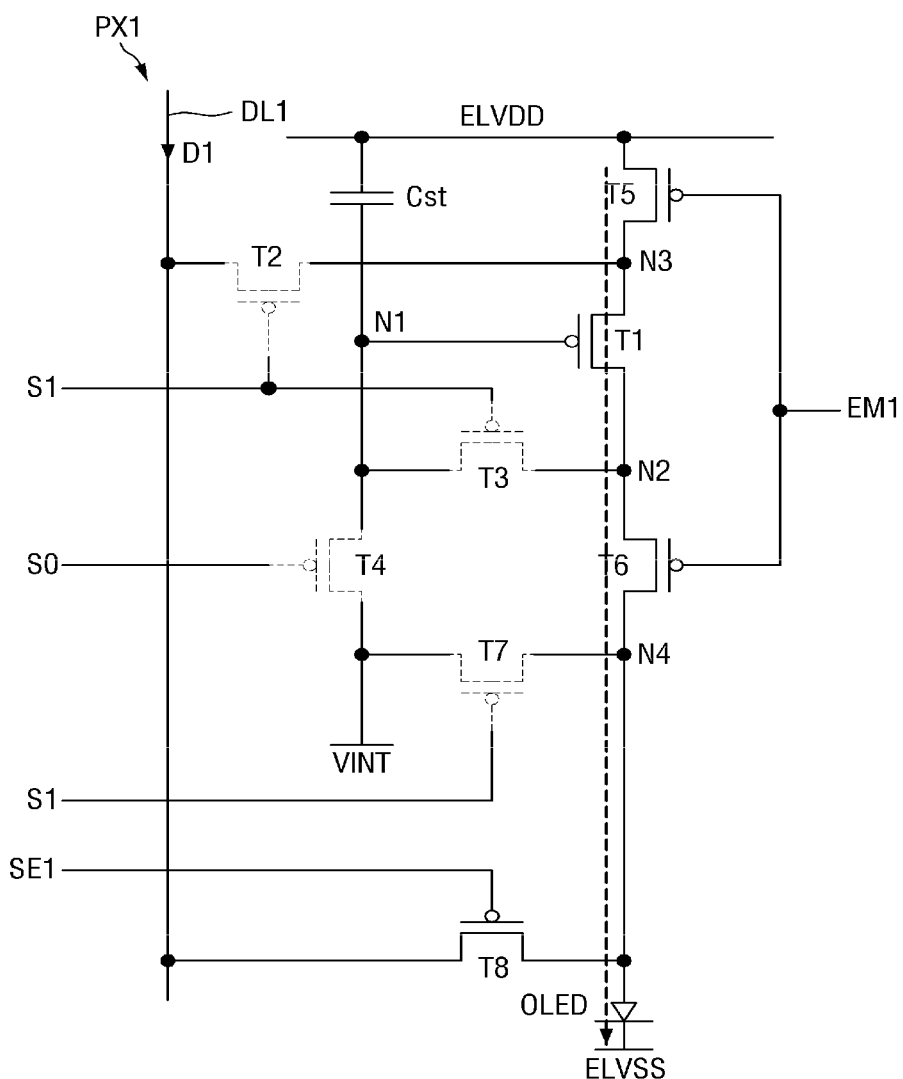
Figure 10B:
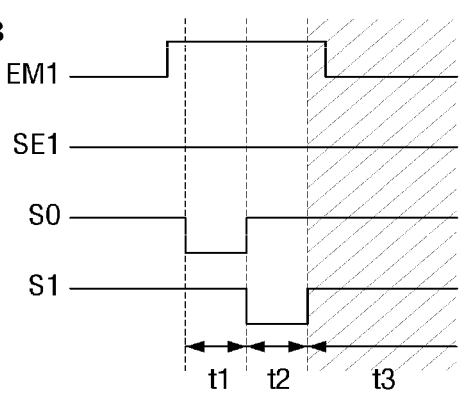

Accordingly, referring to FIG. 10A, the fifth transistor T5 and the sixth transistor T6 are turned on, and the second transistor T2, the third transistor T3 and the seventh transistor T7 are turned off. When the fifth transistor T5 and the sixth transistor T6 are turned on, a driving current flows through the organic light-emitting diode OLED via the fifth transistor T5, the first transistor T1 and the sixth transistor T6 from the first driving voltage ELVDD.

It is to be noted that if the emission driver 150 described above with respect to FIG. 1 is formed of, for example, a shift register and the like, the change in the voltage level of the $i^{th}$ emission control signal EMi necessary for measuring the hysteresis of the $k^{th}$ pixel unit PXk may be equally applied to the first pixel unit PX1 where the hysteresis is not measured. That is, the first emission control signal EM1 having two turn-on levels during the first frame 1frame may be provided to the first pixel unit PX1.

Next, the operation of the $k^{th}$ pixel unit PXk included in the hysteresis area will be described in more detail with reference to FIGS. 11A to 17B. Elements already described above with reference to FIGS. 8A to 10B may not be described again.

Figure 11A:
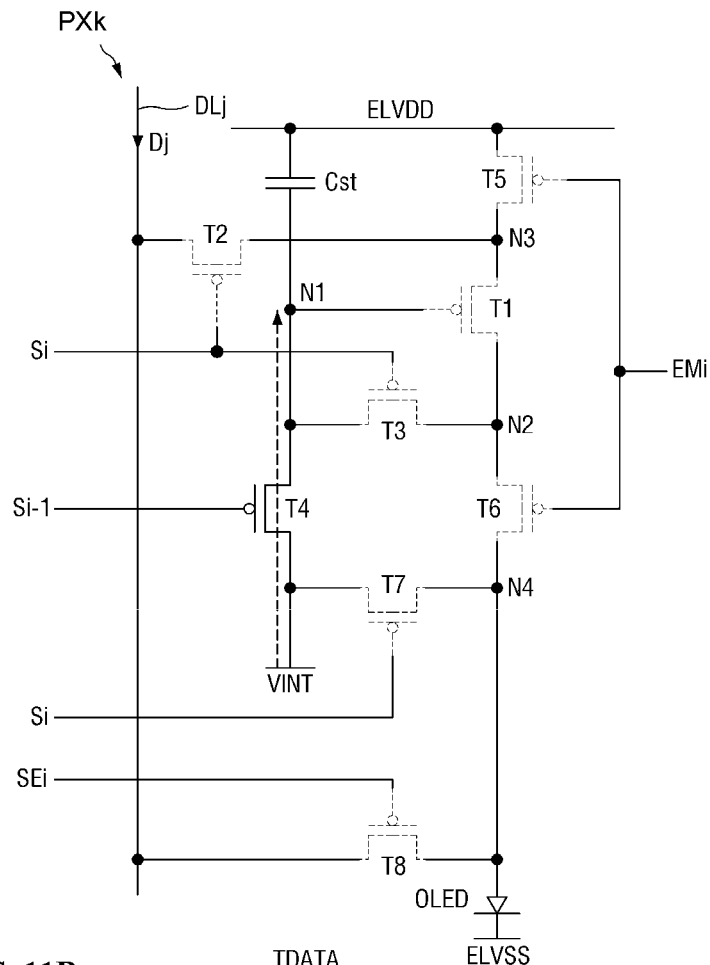
FIG. 11A, FIG. 11B, FIG. 12A, FIG. 12B, FIG. 13A, FIG. 13B, FIG. 14A, FIG. 14B, FIG. 15A, and FIG. 15B are diagrams for illustrating the hysteresis measurement mode of the $k^{th}$ pixel unit according to one or more embodiments.
Figure 11B:
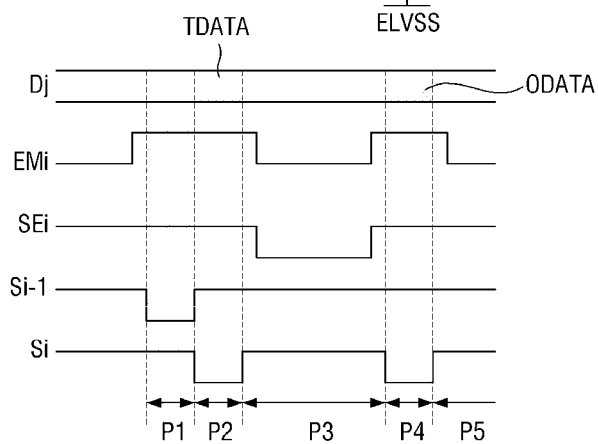

Referring to FIG. 11B, during the first measurement period P1, the $(i-1)^{th}$ scan signal S(i-1) is switched from the high level to the low level. The $i^{th}$ sensing signal SEi, the $i^{th}$ scan signal Si and the $i^{th}$ emission control signal EMi remain at the high level.

Referring to FIG. 11A and FIG. 11B, when the $(i-1)^{th}$ scan signal S(i-1) is switched from the high level to the low level, the fourth transistor T4 of the $k^{th}$ pixel unit PXk is turned on. The fourth transistor T4 of the $k^{th}$ pixel unit PXk may provide the initialization voltage VINT to the first node N1. The gate electrode of the first transistor T1 of the $k^{th}$ pixel unit PXk is set to the initialization voltage VINT. That is, the first measurement period P1 is an initialization period.

Figure 12A:
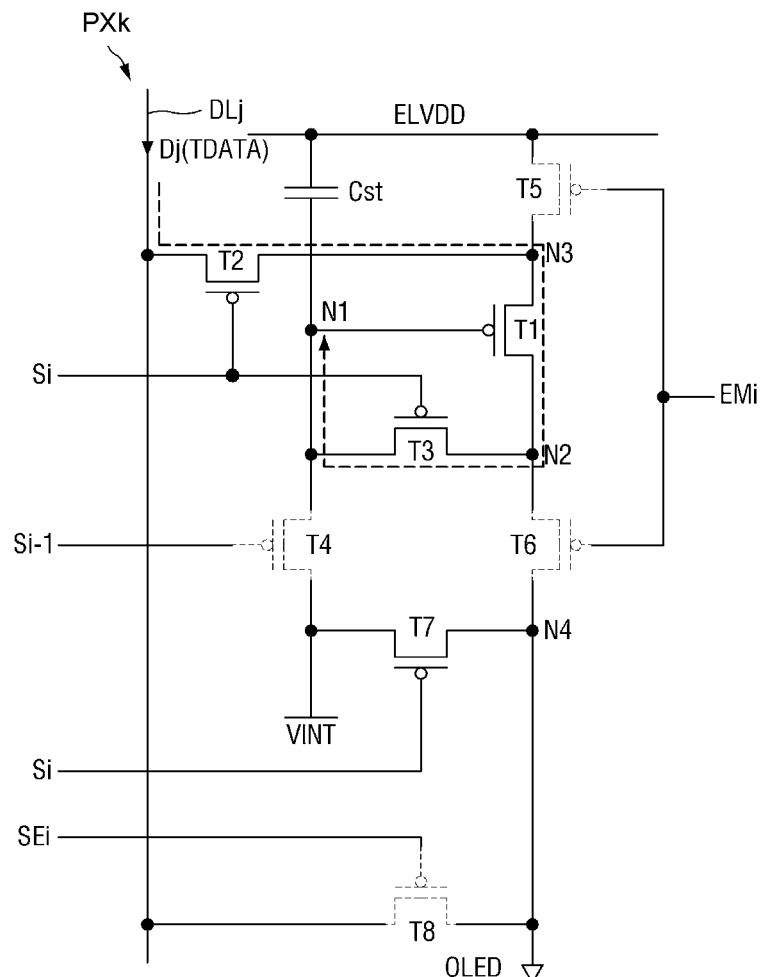
Figure 12B:
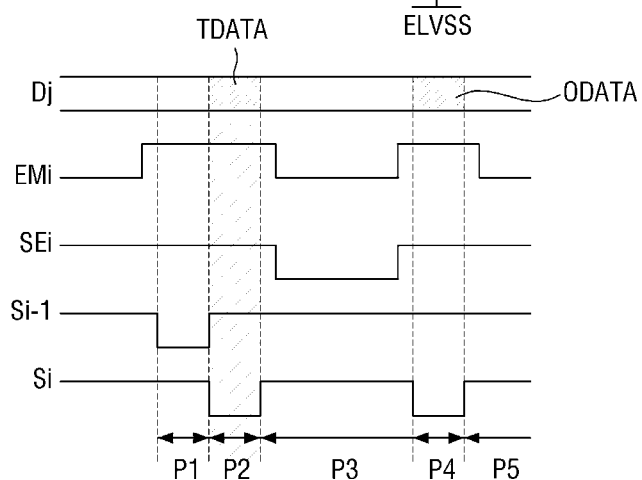

Referring to FIG. 12B, during the second measurement period P2, the $i^{th}$ scan signal Si is switched from the high level to the low level. In addition, the $(i-1)^{th}$ scan signal S(i-1) is switched from the low level to the high level. The $i^{th}$ sensing signal SEi and the $i^{th}$ emission control signal EMi remain at the high level.

As a result, referring to FIG. 12A, the second transistor T2, the third transistor T3 and the seventh transistor T7 of the $k^{th}$ pixel unit PXk are turned on, and the fourth transistor T4 is turned off. When the third transistor T3 of the $k^{th}$ pixel unit PXk is turned on, the first transistor T1 becomes diode-connected. The $j^{th}$ data signal Dj provided from the $j^{th}$ data line DLj is provided at the first node N1 via the second transistor T2, the third node N3 and the third transistor T3 of the $k^{th}$ pixel unit PXk. The $j^{th}$ data signal Dj is a data signal corresponding to the measurement data TDATA. That is, the source electrode of the first transistor T1 may receive the $j^{th}$ data signal Dj corresponding to the measurement data TDATA for hysteresis measurement through the $j^{th}$ data line DLj.

Since the first transistor T1 of the $k^{th}$ pixel unit PXk is diode-connected, the first node N1 receives a voltage equal to the difference between the voltage corresponding to the $j^{th}$ data signal Dj and the threshold voltage Vth of the first transistor T1. Specifically, the first node N1 of the $k^{th}$ pixel unit PXk receives a voltage equal to the voltage corresponding to the $j^{th}$ data signal Dj minus the absolute value of the threshold voltage Vth of the first transistor T1 of the $k^{th}$ pixel unit PXk. The storage capacitor Cst stores the charges corresponding to the voltage difference between the difference voltage provided at the first node N1 and the first driving voltage ELVDD. That is, the second measurement period P2 is a period in which the measurement data TDATA for measuring the hysteresis of the first transistor T1 of the $k^{th}$ pixel unit PXk is input.

In addition, during the second measurement period P2, the timing controller 140 may control the signal output from the scan driver 120 with the first control signal CONT1. More specifically, after outputting the $i^{th}$ scan signal Si at the low level, the output of the $(i+1)^{th}$ scan signal S(i+1) subsequent to the $i^{th}$ scan signal Si can be held at the high level. The $(i+1)^{th}$ scan signal S(i+1) is switched to the turn-on level, i.e., the low level after the fourth period P4.

The timing controller 140 may control the signal output from the emission driver 150 with the third control signal CONT3 in an interval between the second measurement period P2 and the third measurement period P3. More specifically, after outputting the $i^{th}$ emission control signal EMi at the high level, the output of the $(i+1)^{th}$ emission control signal subsequent to the $i^{th}$ emission control signal EMi can be held at the low level.

Subsequently, the third measurement period P3 will be described. The third measurement period P3 is a period for measuring the hysteresis.

Figure 13A:
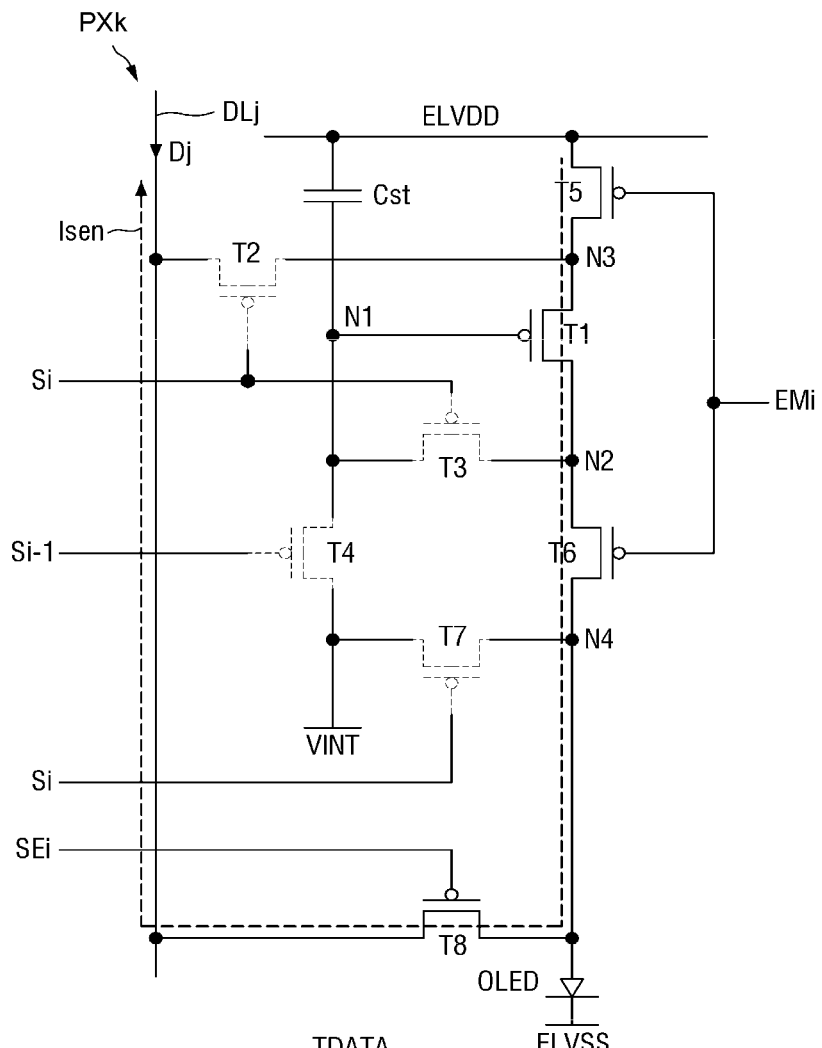
Figure 13B:
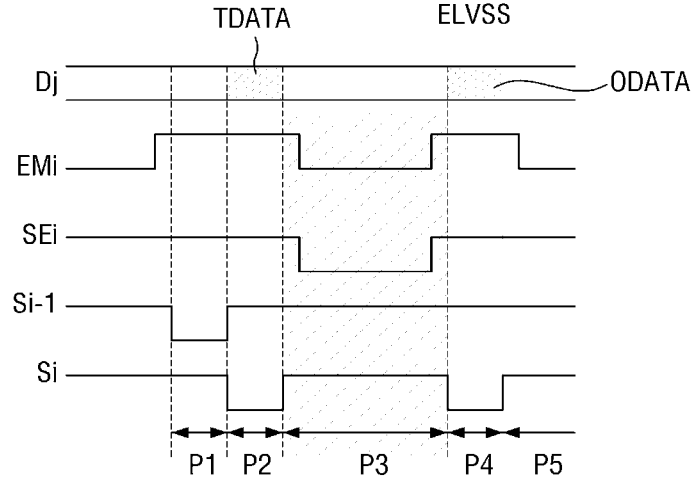

Referring to FIG. 13B, during the third measurement period P3, the $i^{th}$ scan signal Si is switched from the low level to the high level. In addition, during the third measurement period P3, the $i^{th}$ emission control signal EMi is switched from the high level to the low level. In addition, the $i^{th}$ sensing signal SEi, the $(i-1)^{th}$ scan signal S(i−1) and the $i^{th}$ scan signal Si remain at the high level.

As a result, referring to FIG. 13A, the second transistor T2, the third transistor T3 and the seventh transistor T7 of the $k^{th}$ pixel unit PXk are turned off, and the eighth transistor T8 and the ninth transistor T9 remain turned off. On the other hand, the fifth transistor T5 and the sixth transistor T6 are turned on during the third measurement period P3.

Descriptions will be made below with reference to FIGS. 4 and 13A. When the fifth transistor T5, the sixth transistor T6 and the eighth transistor T8 are turned on, an electric current path is formed from the source electrode of the fifth transistor T5, to which the first driving voltage ELVDD is applied, to the $j^{th}$ data line DLj via the first transistor T1, the sixth transistor T6 and the eighth transistor T8. On the other hand, for the third measurement period P3, the signal path between the sensing unit 132 and the $j^{th}$ data line DLj is also connected as the second switch 133b is turned on. Accordingly, the second input terminal of the operational amplifier 132a1 is electrically connected to the first transistor T1 through the eighth transistor T8 of the $k^{th}$ pixel unit PXk. The sensing circuit 132a may provide the voltage corresponding to the sensing current Isen and the sensing voltage Vsen generated using the reference voltage Vset to the ADC 132b. The ADC 132b may provide the timing control unit 140 with the sensing data SDATA converted from the sensing voltage Vsen.

That is, as the eighth transistor T8 is turned on during the third measurement period P3, the result of measuring the hysteresis of the first transistor T1 of the $k^{th}$ pixel unit PXk may be provided to the timing controller 140 as the sensing data SDATA. In this manner, the hysteresis of the $k^{th}$ pixel unit PXk determined as the hysteresis area may be measured in real-time-time during the first active period act1. As the hysteresis is measured in real-time-time during the first active period act1, the measurement accuracy of the hysteresis of the first transistor T1 of the $k^{th}$ pixel unit PXk and the signal-to-noise ratio (SNR) can be improved.

Figure 14A:
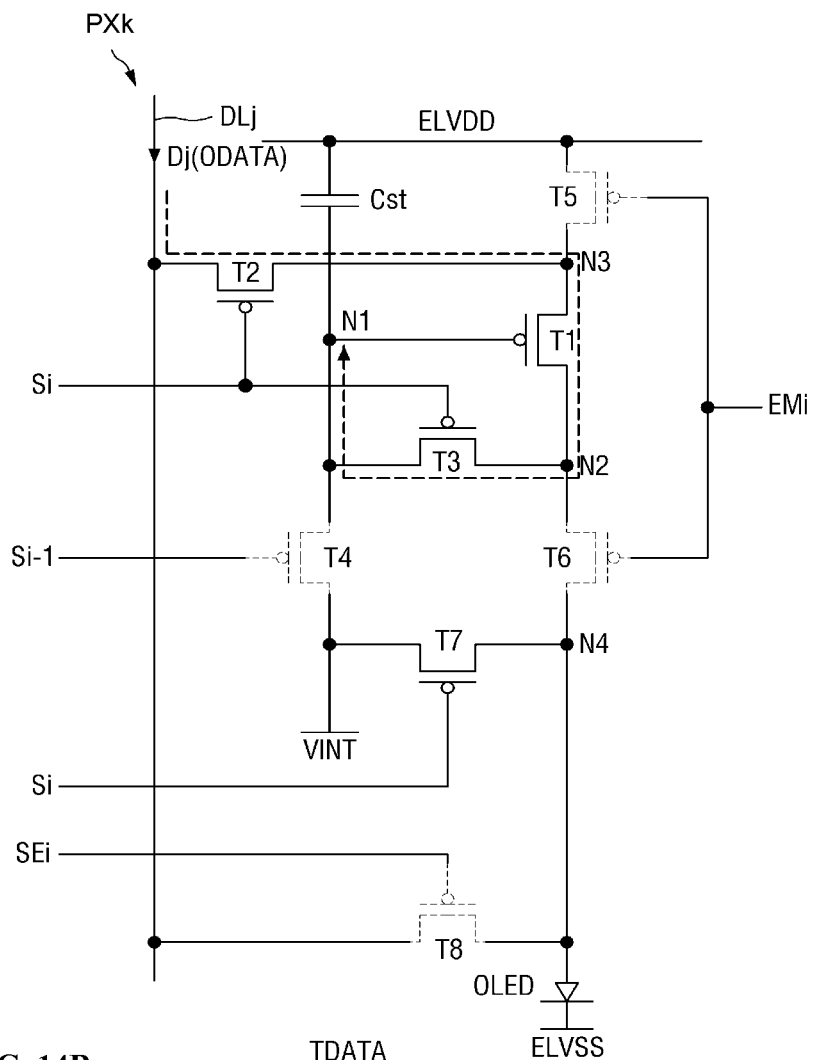
Figure 14B:
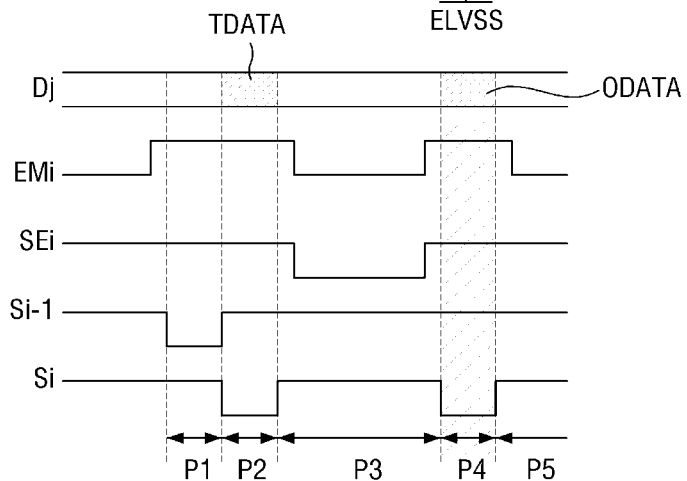

Referring to FIG. 14B, during the fourth measurement period P4, the $i^{th}$ scan signal Si is switched from the high level to the low level. In addition, during the fourth measurement period P4, the $(i-1)^{th}$ scan signal S(i−1), the $i^{th}$ sensing signal SEi and the $i^{th}$ emission control signal EMi remain at the high level.

As a result, referring to FIG. 14A, the second transistor T2, the third transistor T3 and the seventh transistor T7 of the $k^{th}$ pixel unit PX1 are turned on, and the fourth transistor T4 is turned off. When the third transistor T3 of the $k^{th}$ pixel unit PXk is turned on, the first transistor T1 becomes diode-connected. The $j^{th}$ data signal Dj provided from the $i^{th}$ data line DLj through the second transistor T2 of the $k^{th}$ pixel unit PXk is provided at the first node N1 via the third node N3 and the third transistor T3. The $j^{th}$ data signal Dj is a data signal corresponding to the grayscale data ODATA. That is, the source electrode of the first transistor T1 may receive the $j^{th}$ data signal Dj having the grayscale level at which the $k^{th}$ pixel unit PXk is to emit light during the first frame 1frame through the $j^{th}$ data line DLj. That is, the fourth measurement period P4 is a period in which the grayscale data ODATA having the grayscale level at which the $k^{th}$ pixel unit PXk is to emit light is input.

Figure 15A:
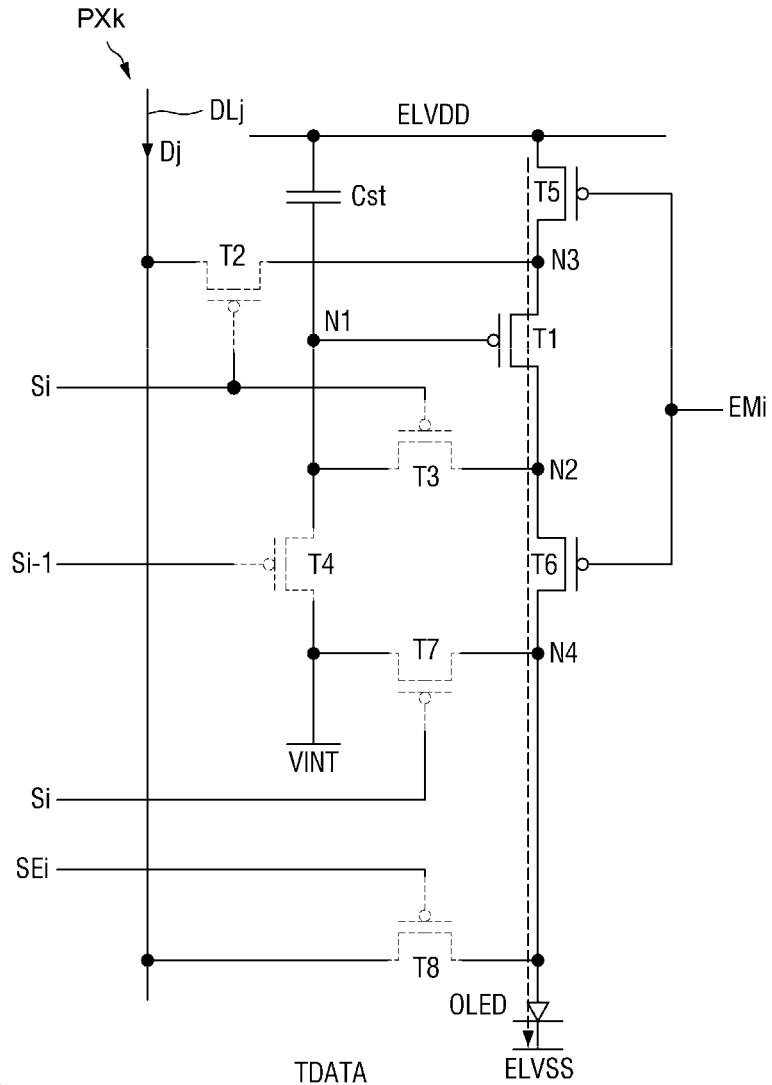
Figure 15B:
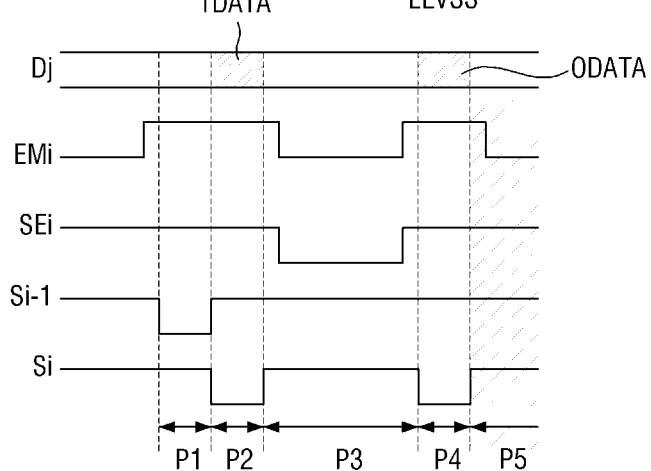

Referring to FIG. 15B, during the fifth measurement period P5, the $i^{th}$ scan signal Si is switched from the low level to the high level, and the $(i-1)^{th}$ scan signal S(i−1) and the $i^{th}$ sensing signal SEi remain at the high level. In addition, during the fifth measurement period P5, the $i^{th}$ emission control signal EMi is switched from the high level to the low level.

Accordingly, referring to FIG. 15A, the fifth transistor T5 and the sixth transistor T6 are turned on, and the second transistor T2, the third transistor T3 and the seventh transistor T7 are turned off. In addition, the fourth transistor T4 and the eighth transistor T8 remain turned off.

When the fifth transistor T5 and the sixth transistor T6 are turned on, a driving current flows through the organic light-emitting diode OLED via the fifth transistor T5, the first transistor T1 and the sixth transistor T6 from the first driving voltage ELVDD. On the other hand, the $k^{th}$ pixel unit PXk emits light at the grayscale level corresponding to the grayscale data ODATA during the fifth measurement period P5. That is, the fifth measurement period P5 is an emission period.

During the first period P1 and the third period P3, the $i^{th}$ scan signal Si having the low level is provided to the $k^{th}$ pixel unit PXk twice. It is to be noted that the $i^{th}$ scan signal Si having the low level is also provided to the $(k+1)^{th}$ pixel unit (not shown) located in the pixel row next to the $k^{th}$ pixel unit PXk. Accordingly, the $(k+1)^{th}$ pixel unit may receive the $i^{th}$ scan signal Si having two low levels from the $i^{th}$ scan line SLi. This means that the fourth transistor T4 included in the $(k+1)^{th}$ pixel unit is turned on twice, and thus the $(k+1)^{th}$ pixel unit may perform the initialization of the gate electrode of the first transistor T1 twice.

Next, the operation of the $k^{th}$ pixel unit PXk in the second frame 2frame will be described with reference to FIGS. 16A to 18B. FIGS. 16A to 18B are diagrams for illustrating the operation of the $k^{th}$ pixel unit in the second frame. Elements already described above with reference to FIGS. 8A to 15B may not be described again.

The second frame (2frame) is subsequent to the first frame (1frame) as described above. It is assumed that there is no hysteresis measurement during the second frame (2frame), and the compensation operation of the $k^{th}$ pixel unit PXk will be described in more detail.

Figure 16A:
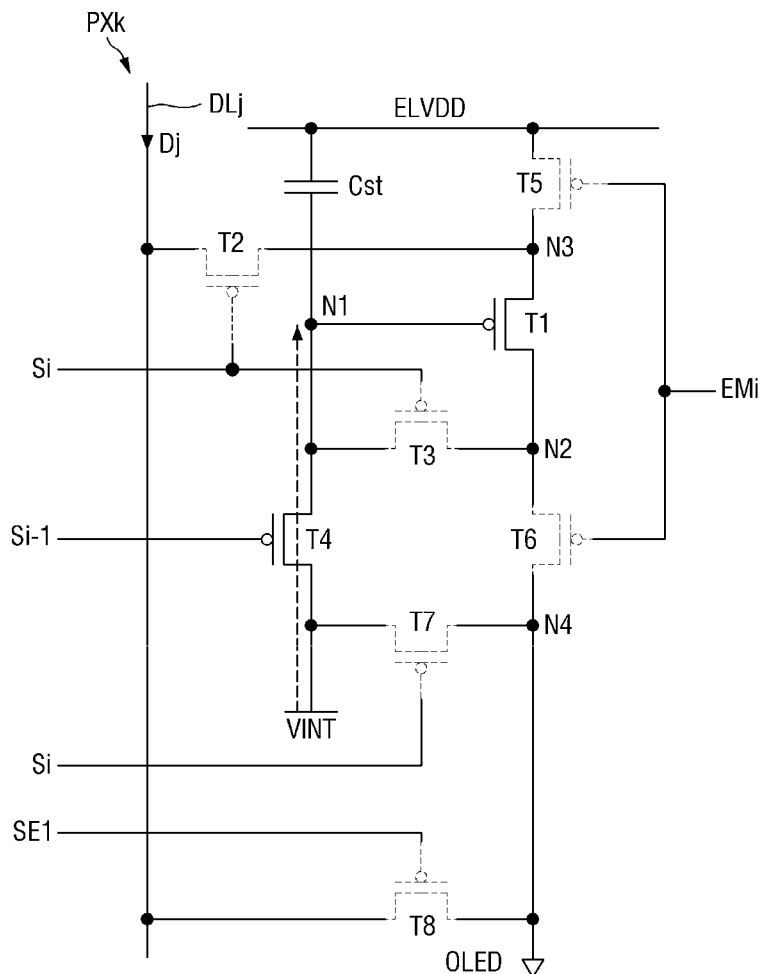
FIG. 16A, FIG. 16B, FIG. 17A, FIG. 17B, FIG. 18A, and FIG. 18B are diagrams for illustrating the operation of the $k^{th}$ pixel unit in the second frame according to one or more embodiments.
Figure 16B:
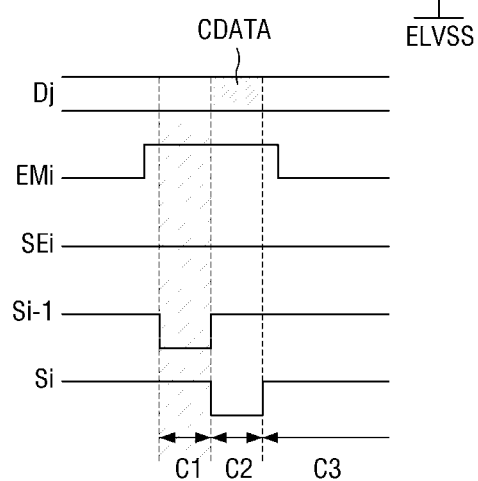

Referring to FIG. 16B, during a first compensation period C2, the $(i-1)^{th}$ scan signal S(i−1) is switched from the high level to the low level. The $i^{th}$ sensing signal SEi, the $i^{th}$ scan signal Si and the $i^{th}$ emission control signal EMi remain at the high level. Accordingly, referring to FIG. 16A, the gate electrode of the first transistor T1 of the $k^{th}$ pixel unit PXk is set to the initialization voltage VINT.

Figure 17A:
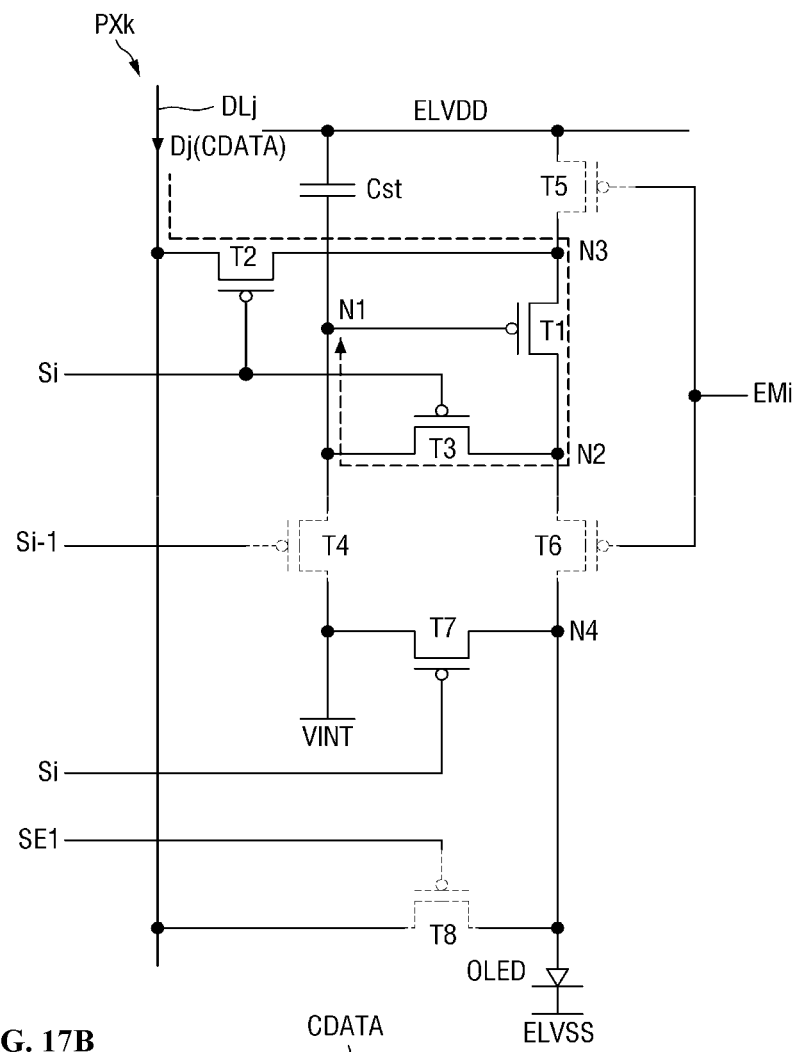
Figure 17B:
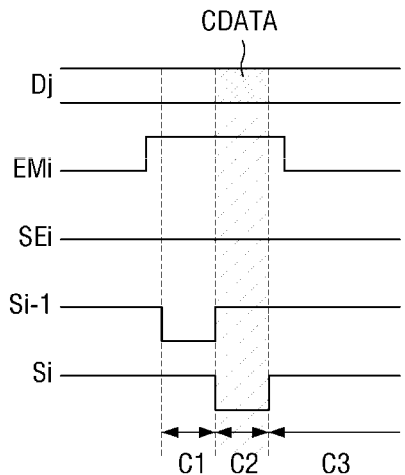

Referring to FIG. 17B, during the second compensation period C2, the $i^{th}$ scan signal Si is switched from the high level to the low level. In addition, the $(i-1)^{th}$ scan signal S(i−1) is switched from the low level to the high level. The $i^{th}$ sensing signal SEi and the $i^{th}$ emission control signal EMi remain at the high level.

As a result, referring to FIG. 17A, the second transistor T2, the third transistor T3 and the seventh transistor T7 of the $k^{th}$ pixel unit PX1 are turned on, and the fourth transistor T4 is turned off. When the third transistor T3 of the $k^{th}$ pixel unit PXk is turned on, the first transistor T1 becomes diode-connected. The $j^{th}$ data signal Dj provided from the $j^{th}$ data line DLj is provided at the first node N1 via the second transistor T2, the third node N3 and the third transistor T3 of the $k^{th}$ pixel unit PXk. The $j^{th}$ data signal Dj is a data signal corresponding to the compensation data CDATA. That is, the source electrode of the first transistor T1 may receive the $j^{th}$ data signal Dj corresponding to the compensation data CDATA in which the hysteresis measured during the first frame 1frame is reflected.

Figure 18A:
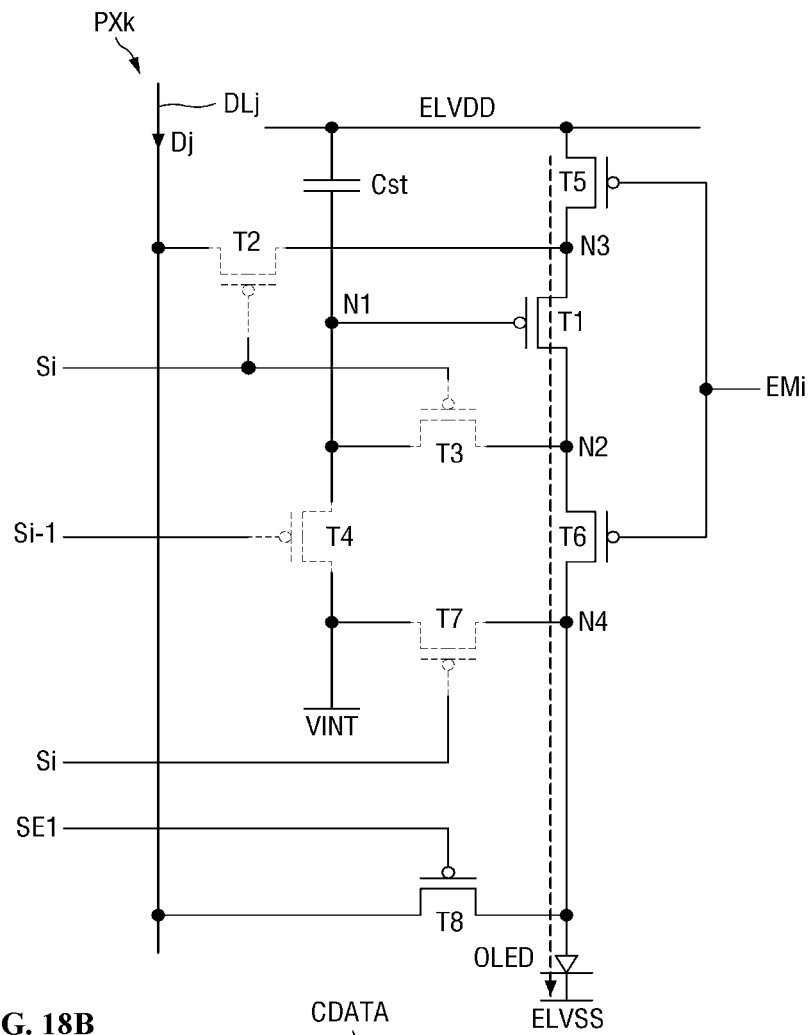
Figure 18B:
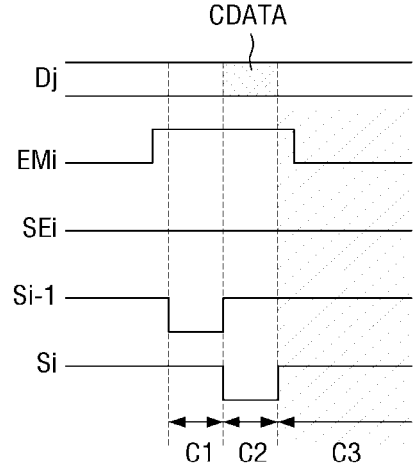

Referring to FIG. 18B, during the third compensation period C3, the $i^{th}$ scan signal Si is switched from the low level to the high level, and the $(i-1)^{th}$ scan signal S(i-1) and the $i^{th}$ sensing signal SEi remain at the high level. In addition, during the third compensation period C3, the $i^{th}$ emission control signal EMi is switched from the high level to the low level.

Referring to FIG. 18A, when the fifth transistor T5 and the sixth transistor T6 are turned on, a driving current flows through the organic light-emitting diode OLED via the fifth transistor T5, the first transistor T1 and the sixth transistor T6 from the first driving voltage ELVDD. On the other hand, the $k^{th}$ pixel unit PXk emits light at the grayscale level corresponding to the compensation data CDATA during the fifth measurement period P5. That is, the $k^{th}$ pixel unit PXk receives the compensation data CDATA in which the hysteresis is compensated for, thereby improving instantaneous residual image due to the hysteresis.

It is to be noted that although the first to third compensation periods C1 to C3 are illustrated as being included in the second frame 2frame subsequent to the first frame 1frame, this is merely illustrative. For example, the first to third compensation periods C1 to C3 may be included in the frame next to the second frame 2frame.

In addition, although FIGS. 1 to 15B illustrate that the first pixel unit PX1 includes the first to eighth transistors T1 to T8, this is merely illustrative. That is, at least some of the third transistor T3 as the compensating transistor, the fourth transistor T4 as the initializing transistor, the fifth and sixth transistors T5 and T6 as the emission-controlling transistor and the seventh transistor T7 as the bypass transistor may not be implemented in some embodiments.

Figure 19:
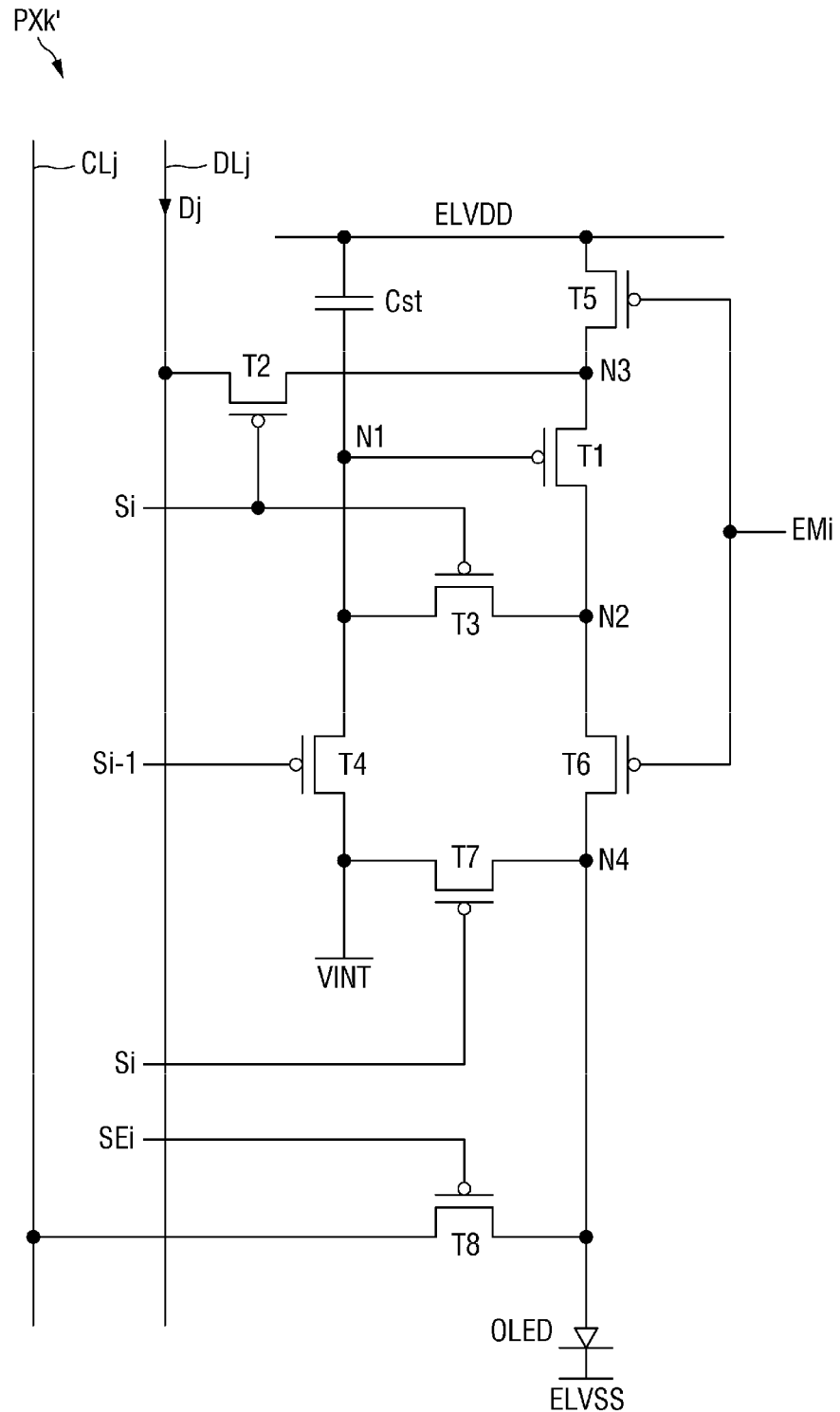
FIG. 19 is an equivalent circuit diagram of a $k^{th}$ pixel unit of an organic light-emitting display device according to an embodiment.

FIG. 19 is an equivalent circuit diagram of a $k^{th}$ pixel unit according to an embodiment. Elements already described above with reference to FIGS. 1 to 18B may not be described again.

Referring to FIG. 19, the eighth transistor T8 may be connected to a separate $j^{th}$ sensing line CLj instead of the $j^{th}$ data line DLj. That is, the $k^{th}$ pixel unit PXk' may separate the $j^{th}$ data line DLj to which the $j^{th}$ data signal Dj is provided, and the $j^{th}$ sensing line CLj for measuring the hysteresis of the first transistor T1. The $j^{th}$ sensing line CLj may be directly connected to the sensing unit 132 described above with respect to FIG. 3.

Figure 20:
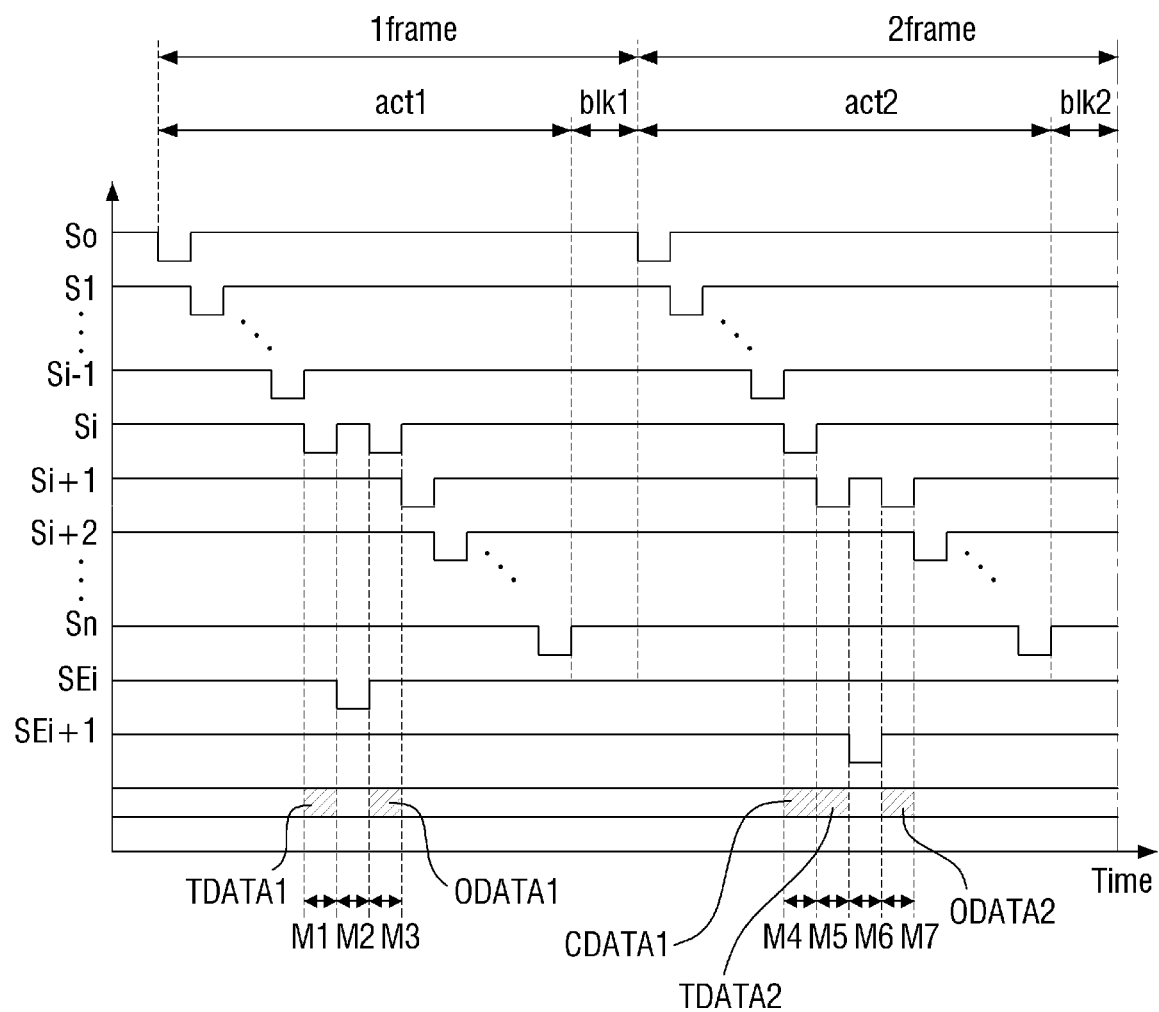
FIG. 20 is a diagram for illustrating a driving operation of an organic light-emitting display device according to an embodiment.

FIG. 20 is a diagram for illustrating a driving operation of an organic light-emitting display device according to an embodiment.

Unlike the scheme for driving an organic light-emitting display device illustrated in FIG. 7, according to the scheme for driving the organic light-emitting display device illustrated in FIG. 20, both compensation and hysteresis measurement are performed during the second frame 2frame.

That is, independently of the provision of the $j^{th}$ data signal Dj corresponding to the compensation data CDATA during the second frame 2frame, the hysteresis characteristic may be measured on the other pixel units than the $k^{th}$ pixel unit PXk.

It is assumed in FIG. 20 that the $i^{th}$ scan signal Si is provided to the $k^{th}$ pixel unit PXk. It is also assumed in FIG. 20 that the $(i+1)^{th}$ scan signal S(i+1) is provided to the $(k+1)^{th}$ pixel unit PX(k+1). The $(k+1)^{th}$ pixel unit PX(k+1) is a pixel unit that is disposed in the next row to the row in which the $k^{th}$ pixel unit PXk is disposed, immediately neighbors the $k^{th}$ pixel unit PXk with no intervening pixel, and receives the same data signal. The $k^{th}$ pixel unit PXk is a pixel unit in which hysteresis is measured during the first frame 1 frame. The $(k+1)^{th}$ pixel unit PX(k+1) is a pixel unit in which hysteresis is measured during the second frame 2frame.

Referring to FIG. 20, the $k^{th}$ pixel unit PXk may receive first measurement data TDATA1 in a first period M1. Based on the first measurement data TDATA1, the hysteresis of the $k^{th}$ pixel portion PXk may be measured in a second period M2. On the other hand, the $k^{th}$ pixel unit PXk emits light based on the first grayscale data ODATA1 received in a third period M3.

In a fourth period M4, the $k^{th}$ pixel unit PXk may receive first compensation data CDATA1 generated based on the hysteresis measured in the second frame 2frame. Independently of this, the $(k+1)^{th}$ pixel unit PX(k+1) may receive second measurement data TDATA2 in a fifth period M5. Based on the second measurement data TDATA2, the hysteresis of the $(k+1)^{th}$ pixel unit PX(k+1) may be measured during a sixth period M6. The $(k+1)^{th}$ pixel unit PX(k+1) emits light based on the second grayscale data ODATA2 received in a seventh period M7.

That is, in the second frame 2frame, the $k^{th}$ pixel unit PXk receives the first compensation data CDATA1 in which the hysteresis is compensated for, while the hysteresis of the $(k+1)^{th}$ pixel unit PX(k+1) is measured based on the second measurement data TDATA2.

It is to be understood that although the hysteresis of only one pixel unit is measured during the frame in an example embodiment, this is merely illustrative. That is, hysteresis of two or more pixel units may be measured simultaneously in the frame. The two pixel units may be arranged either in different rows or in the same row. When the hysteresis of two or more pixel units in the frame is measured, the lengths of the active period and the blank period may be adjusted.

What is claimed is:

1. An organic light-emitting display device comprising:
    a plurality of pixels each comprising a sensing transistor and a scan transistor;
    a plurality of data lines;
    first to n-th scan lines, where n is a natural number equal to or greater than two;
    a data driver electrically connected to the scan transistor of each of the plurality of the pixels through the plurality of the data lines; and
    a scan driver electrically connected to the scan transistor of each of the plurality of the pixels through the first to n-th scan lines,
    wherein the scan transistor connected to i-th scan line is turned on during a first period and a second period, where i is a natural number equal to or greater than two and less than n,
    wherein the sensing transistor is turned on during a third period between the first period and the second period,
    wherein the scan transistor connected to (i+1)-th scan line is turned off from the first period to second period,
    wherein the first period, the second period, and the third period are included in a first frame,
    wherein a second frame immediately follows the first frame, and
    wherein the scan transistor connected to the i-th scan line is turned on one more time than the scan transistor connected to the (i+1)-th scan line for the second frame.

2. The device of claim 1, further comprising a signal path, wherein a first pixel of the plurality of pixels further comprises a driving transistor electrically connected to the scan transistor, and further comprises an organic light-emitting diode electrically connected to the driving transistor through the signal path, and wherein the sensing transistor is electrically connected to the signal path.

3. The device of claim 2, wherein the data driver provides a first data signal corresponding to measurement data to the first pixel during the first period, and provides a second data signal corresponding to grayscale data to the first pixel during the second period.

4. The device of claim 3, wherein the sensing transistor measures a driving current of the driving transistor corresponding to the first data signal during the third period.

5. The device of claim 2, wherein the scan transistor comprises a first terminal electrically connected to the first data line, a control electrode electrically connected to the first scan line, and a second terminal electrically connected through no intervening transistor to a first terminal of the driving transistor,
wherein the driving transistor comprises a control electrode electrically connected through no intervening transistor to a first node and a second terminal electrically connected to the organic light-emitting diode, and
wherein the sensing transistor comprises a first terminal electrically connected to the second terminal of the driving transistor and a second terminal electrically connected through no intervening transistor to the first data line.

6. The device of claim 5, wherein the first pixel further comprises:
a compensating transistor comprising a control electrode electrically connected to the first scan line, a first terminal electrically connected to the first node, and a second terminal electrically connected to the second terminal of the driving transistor; and
an initializing transistor comprising a first terminal receiving an initialization voltage and a second terminal electrically connected to the first node.

7. The device of claim 1, further comprising:
a second scan line immediately neighboring the first scan line with no intervening scan line; and
a second pixel electrically connected to the second scan line,
wherein the second pixel receives a scan signal having a turn-on level from the second scan line after the second period.

8. The device of claim 1, further comprising:
a second scan line immediately neighboring the first scan line with no intervening scan line; and
a second pixel electrically connected to the second scan line,
wherein the second pixel comprises a compensating transistor having a control electrode electrically connected to the second scan line and a first terminal receiving an initialization voltage, and a driving transistor having a control electrode electrically connected to the first terminal of the compensating transistor, and
wherein the control electrode of the driving transistor of the second pixel receives the initialization voltage during the first period and the third period.

9. An organic light-emitting display device comprising:
a plurality of pixels comprising a first pixel, the first pixel comprising a sensing transistor and a scan transistor;
a first data line;
a first scan line;
a data driver electrically connected to a first terminal of the scan transistor through a first data line;
a timing controller configured to determine a hysteresis area among the plurality of pixels based on an image signal provided from an external device; and
a scan driver electrically connected to a control electrode of the scan transistor through a first scan line,
wherein the scan transistor receives, from the data driver, a first data signal based on measurement data during a first period and a second data signal based on grayscale data during a second period,
wherein the sensing transistor is turned on during a third period between the first period and the second period,
wherein the first pixel is included in the hysteresis area,
wherein the sensing transistor measures a sensing voltage corresponding to the first data signal during the third period, and
wherein the first period, the second period, and the third period are included in a first frame.

10. The device of claim 9, wherein the scan transistor is turned on in each of the first period and the second period.

11. The device of claim 9, wherein the first pixel further comprises a driving transistor electrically connected, through no intervening transistor, to a second terminal of the scan transistor, and
wherein the sensing transistor is electrically connected to a first terminal of the driving transistor.

12. The device of claim 9,
wherein the first pixel further comprises an emission-controlling transistor, and
wherein the emission-controlling transistor is turned off at least two times in the first frame.

13. The device of claim 9, wherein the timing controller generates compensation data based on the sensing voltage, and
wherein the data driver provides a third data signal based on the compensation data to the first terminal of the scan transistor.

14. The device of claim 13, wherein the first terminal of the scan transistor receives the third data signal during a second frame subsequent to the first frame.

15. A method for driving an organic light-emitting display device, the organic light-emitting display device comprising a plurality of pixels connected to first to n-th scan lines, where n is a natural number equal to or greater than two, each of the plurality of the pixels having a scan transistor and a sensing transistor, the method comprising:
providing a first scan signal to turn on the scan transistor connected to i-th scan line during a first period, where i is a natural number equal to or greater than two and less than n;
providing a second scan signal to turn on the scan transistor connected to i-th scan line during a second period subsequent to the first period; and
providing a sensing signal to turn on the sensing transistor during a third period between the first period and the second period, wherein the scan transistor connected to (i+1)-th scan line is turned off from the first period to second period,
wherein the first period, the second period, and the third period are included in a first frame,
wherein a second frame immediately follows the first frame, and
wherein the scan transistor connected to the i-th scan line is turned on one more time than the scan transistor connected to the (i+1)-th scan line for the second frame.

16. The method of claim 15, wherein a first terminal of the scan transistor receives, through a data line, a first data signal based on measurement data during the first period and a second data signal based on grayscale data during the second period.

17. The method of claim 16, wherein each of the plurality of pixels further comprises a driving transistor electrically connected, through no intervening transistor, to a second terminal of the scan transistor, and wherein the sensing transistor is electrically connected to the driving transistor.

18. The method of claim 17, wherein the sensing transistor measures a sensing voltage corresponding to the first data signal during the third period.

19. The method of claim 18, wherein the sensing transistor provides the sensing voltage measured during the third period to the data line.

20. The method of claim 19, wherein the first terminal of the scan transistor receives a data signal corresponding to the compensation data generated based on the sensing voltage during a second frame subsequent to the first frame.

* * * * *